United States Patent
Nishide et al.

(10) Patent No.: US 10,475,674 B2
(45) Date of Patent: Nov. 12, 2019

(54) LIGHT IRRADIATION TYPE HEAT TREATMENT APPARATUS AND METHOD FOR MANUFACTURING HEAT TREATMENT APPARATUS

(71) Applicant: SCREEN Holdings Co., Ltd., Kyoto (JP)

(72) Inventors: Nobuhiko Nishide, Kyoto (JP); Hiroshi Miyake, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 93 days.

(21) Appl. No.: 15/070,147

(22) Filed: Mar. 15, 2016

(65) Prior Publication Data
US 2016/0284573 A1  Sep. 29, 2016

(30) Foreign Application Priority Data

Mar. 25, 2015 (JP) .................................. 2015-62089
Oct. 20, 2015 (JP) ................................ 2015-206277

(51) Int. Cl.
*H01L 21/67* (2006.01)
*H05B 1/02* (2006.01)

(52) U.S. Cl.
CPC ...... *H01L 21/67115* (2013.01); *H05B 1/0233* (2013.01)

(58) Field of Classification Search
CPC ......... H01L 21/67115; H01L 21/67103; H01L 21/68785; H01L 21/324; H01L 21/67248;
(Continued)

(56) References Cited

U.S. PATENT DOCUMENTS 5,156,820 A * 10/1992 Wong .................. B01J 19/0013
                                                        118/725
5,870,526 A *  2/1999 Aschner ............. C23C 16/4401
                                                        118/50.1
(Continued)

FOREIGN PATENT DOCUMENTS

JP         04-079421        7/1992
JP         09-326366 A     12/1997
(Continued)

OTHER PUBLICATIONS

JP2009004427 (Furukawa) listed in IDS of Mar. 15, 2016, machine translated portion from filed prior art is attached.*
(Continued)

*Primary Examiner* — Jimmy Chou
(74) *Attorney, Agent, or Firm* — Ostrolenk Faber LLP

(57) ABSTRACT

A sealing structure is achieved by sandwiching an O ring between an upper chamber window and a chamber side portion and pressing a clamping ring against a top of a peripheral portion of the upper chamber window. Grooving is performed on a lower surface and an upper surface of the peripheral portion of the upper chamber window, to thereby form a plurality of grooves thereon. Flash light traveling into the peripheral portion of the upper chamber window during irradiation with flash light is reflected by the plurality of grooves and is prevented from traveling toward the O ring. This significantly reduces an amount of flash light reaching the O ring, and thus degradation of the O ring due to the irradiation with the flash light can be prevented.

1 Claim, 25 Drawing Sheets

(58) Field of Classification Search
CPC .......... C23C 16/45504; C23C 16/4411; C23C 16/45563; C23C 16/481; C23C 16/4584; C23C 16/52; H05B 3/0047; H05B 6/806; F27D 5/0037; F27D 19/00; F27B 17/0025
USPC .............. 118/712, 725, 729, 730, 728, 733; 428/428; 392/416; 219/390, 410, 405, 219/416, 411
See application file for complete search history.

(56) References Cited

U.S. PATENT DOCUMENTS

| | | | | |
|---|---|---|---|---|
| 6,228,174 | B1* | 5/2001 | Takahashi | C23C 16/4584 118/724 |
| 6,862,404 | B1* | 3/2005 | Yoo | H01L 21/67115 118/50.1 |
| 8,851,886 | B2* | 10/2014 | Morita | C23C 16/4401 118/724 |
| 2002/0066408 | A1* | 6/2002 | Anderson | C30B 25/08 118/712 |
| 2004/0018361 | A1* | 1/2004 | Takahashi | C23C 4/11 428/428 |
| 2005/0268567 | A1* | 12/2005 | Devine | H01L 21/67115 52/204.5 |
| 2007/0092807 | A1* | 4/2007 | Fukushima | G03F 1/32 430/5 |
| 2007/0141846 | A1 | 6/2007 | Nam | 438/703 |
| 2008/0008566 | A1* | 1/2008 | Endo | F27B 17/0025 414/217.1 |
| 2008/0170842 | A1* | 7/2008 | Hunter | H01L 21/67115 392/416 |
| 2010/0133255 | A1* | 6/2010 | Bahng | H01L 21/02071 219/444.1 |
| 2013/0223824 | A1* | 8/2013 | Myo | H05B 3/0047 392/411 |
| 2014/0199056 | A1* | 7/2014 | Chang | H01L 21/67115 392/416 |
| 2015/0037019 | A1* | 2/2015 | Collins | H01L 21/67115 392/418 |
| 2015/0129586 | A1* | 5/2015 | Ikeda | H01L 21/324 219/754 |
| 2015/0246405 | A1* | 9/2015 | Akama | B23K 1/008 392/416 |
| 2015/0340257 | A1* | 11/2015 | Brillhart | H01L 21/67201 392/416 |
| 2015/0348809 | A1* | 12/2015 | Iu | H01L 21/67115 392/416 |
| 2016/0027671 | A1* | 1/2016 | Ranish | G02B 6/00 392/416 |
| 2016/0111306 | A1* | 4/2016 | Ranish | H01L 21/67115 392/416 |
| 2016/0284573 | A1* | 9/2016 | Nishide | H01L 21/67115 |

FOREIGN PATENT DOCUMENTS

| | | |
|---|---|---|
| JP | 10-144618 A | 5/1998 |
| JP | 2000-349028 A | 12/2000 |
| JP | 2003-124206 A | 4/2003 |
| JP | 2005-005667 | 1/2005 |
| JP | 2005-183645 A | 7/2005 |
| JP | 2007-500805 A | 1/2007 |
| JP | 2009-004427 | 1/2009 |
| JP | 2009-143775 A | 7/2009 |

OTHER PUBLICATIONS

Taiwanese Office Action (Application No. 105109264) dated Feb. 8, 2017 and its partial English translation.
Office Action dated Feb. 26, 2019 issued in corresponding Japanese Patent Application No. 2015-206277 and its partial English translation.

* cited by examiner

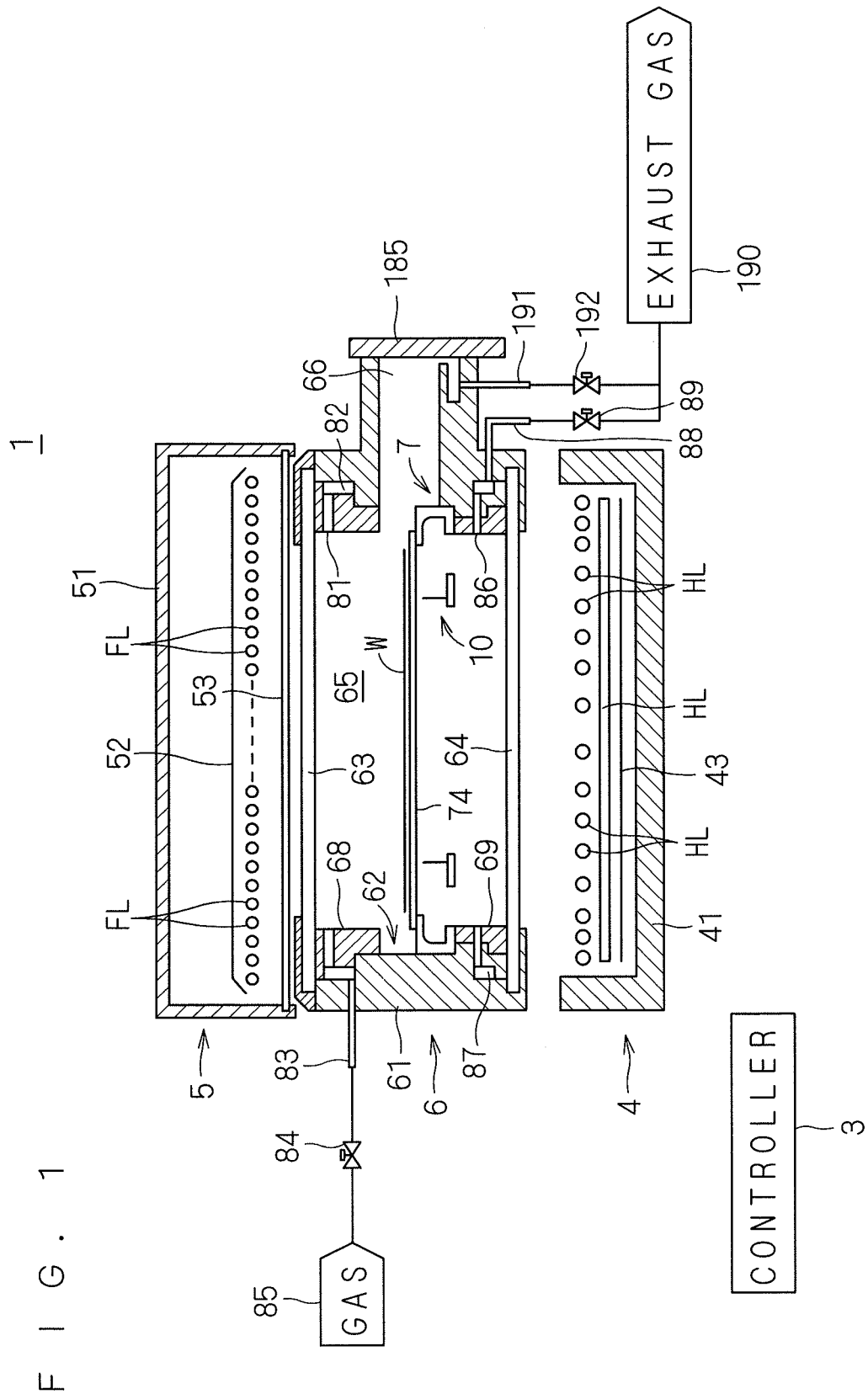
F I G . 1

F I G . 4
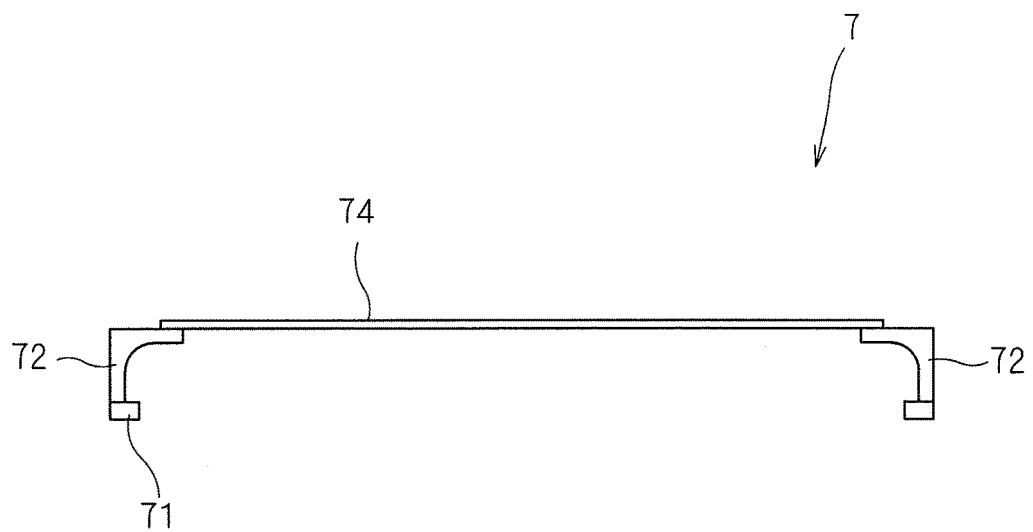

F I G. 7
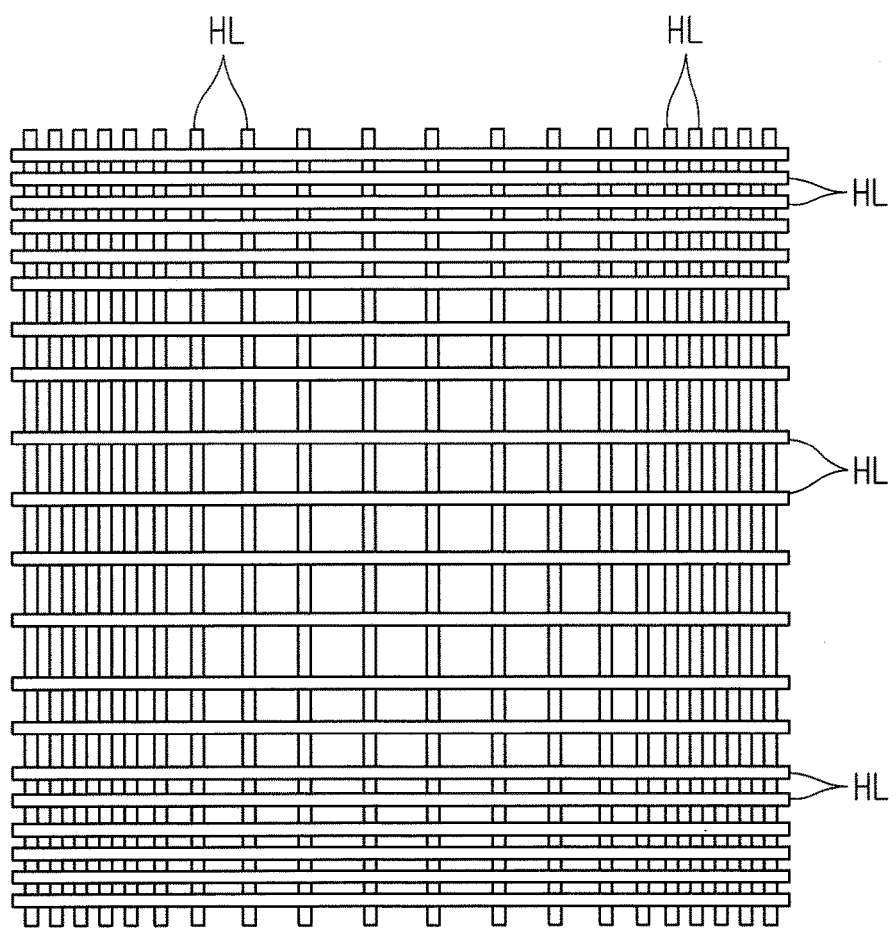

F I G. 9
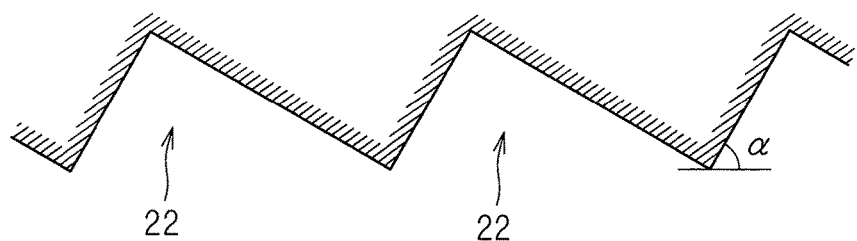

F I G. 1 1
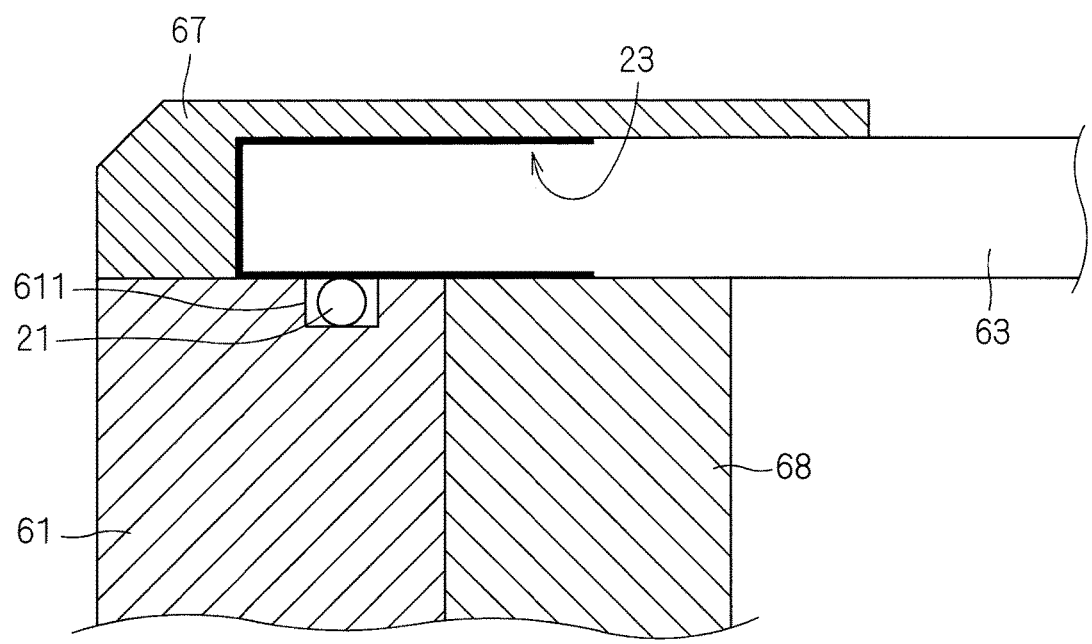

F I G. 1 4
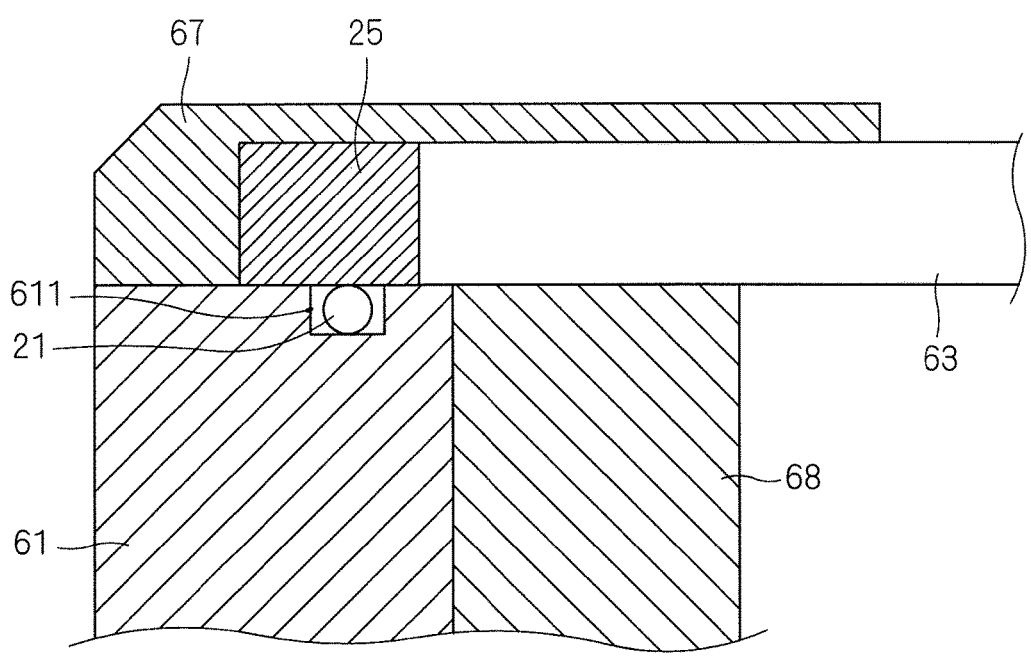

F I G . 15
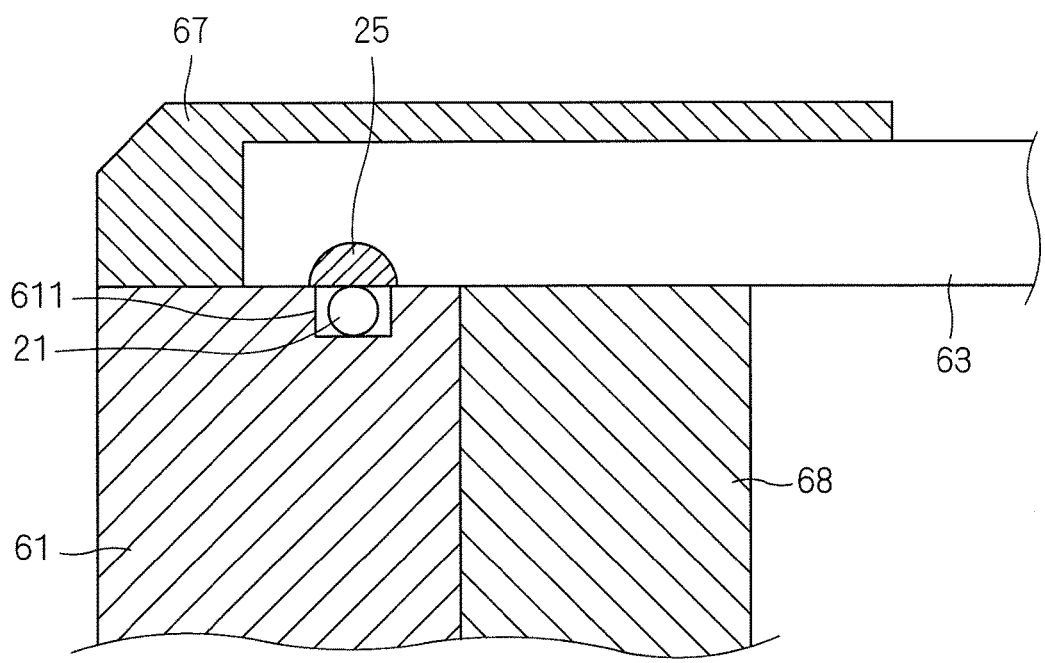

F I G . 1 6
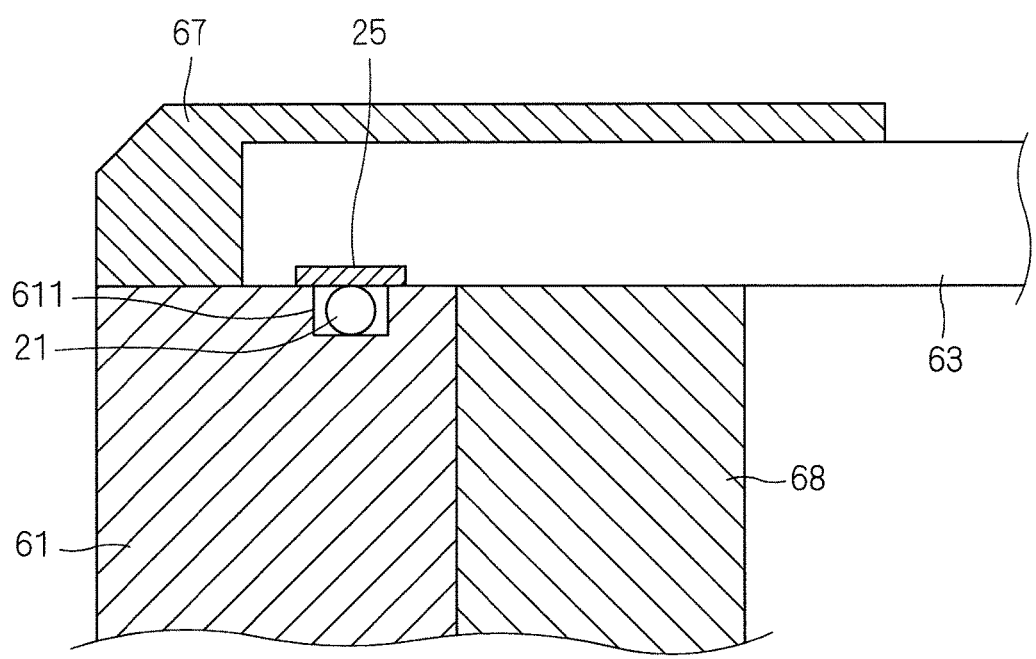

F I G . 1 7
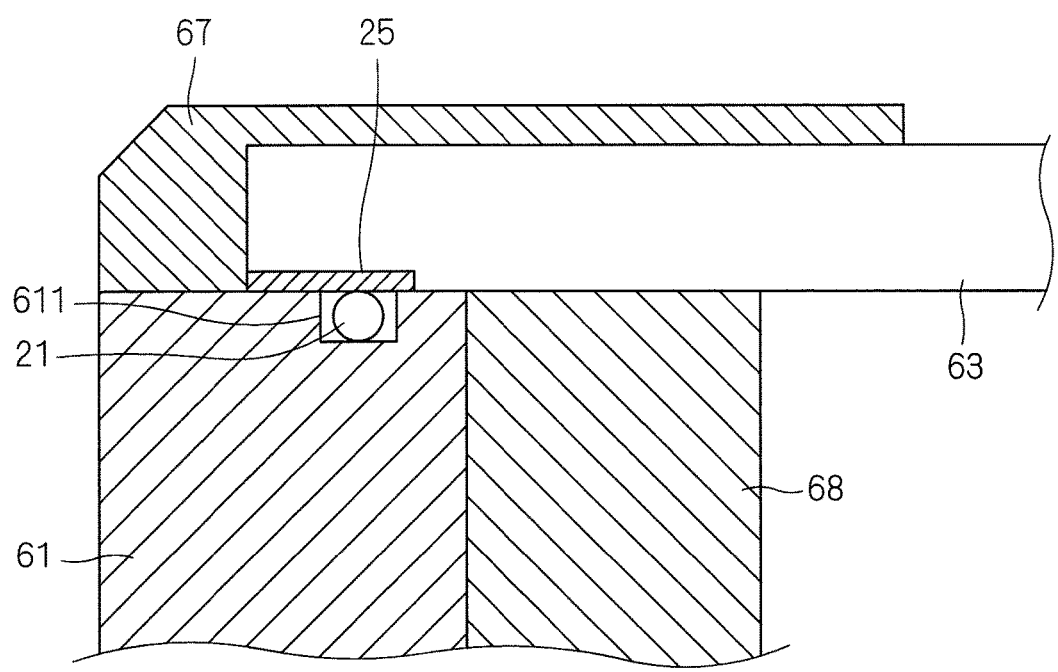

F I G . 1 9
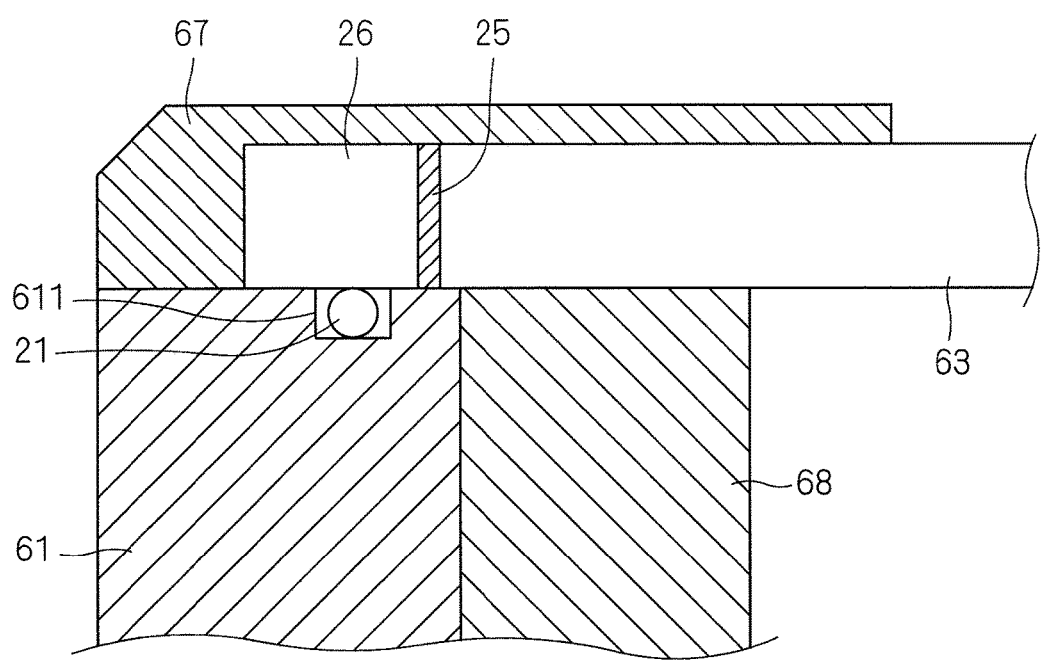

F I G . 2 1
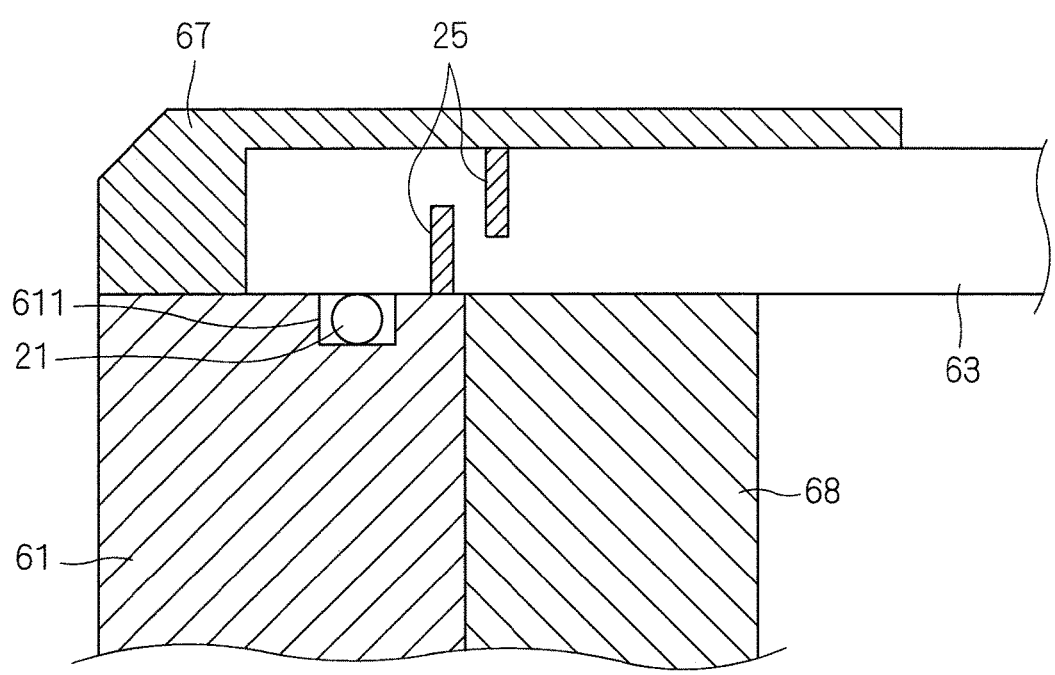

F I G . 2 5
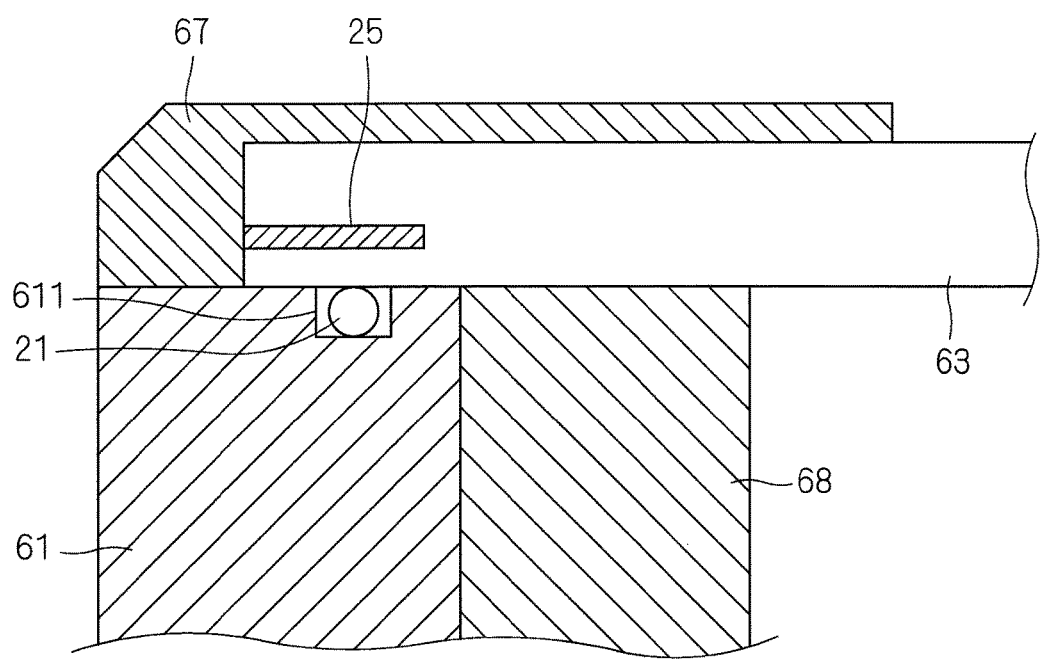

LIGHT IRRADIATION TYPE HEAT TREATMENT APPARATUS AND METHOD FOR MANUFACTURING HEAT TREATMENT APPARATUS

BACKGROUND OF THE INVENTION

Field of the Invention

The present invention relates to a heat treatment apparatus that irradiates a thin-plate precision electronic substrate (hereinafter, merely referred to as a "substrate") such as a semiconductor wafer with flash light to heat the substrate and relates to a method for manufacturing the heat treatment apparatus.

Description of Background Art

In the manufacturing process of a semiconductor device, the introduction of impurities is an essential step for forming pn junctions in a semiconductor wafer. Currently, impurities are typically introduced by ion implantation and subsequent annealing. Ion implantation is a technique for physically implanting impurities by ionizing impurity elements such as boron (B), arsenic (As), and phosphorus (P) and causing the impurity elements to collide with a semiconductor wafer at a high acceleration voltage. The implanted impurities are activated by annealing. If, at this time, annealing time is approximately several seconds or more, the implanted impurities are deeply diffused by heat. As a result, a junction depth may become deeper than necessary, possibly interfering with excellent formation of a device.

Thus, flash lamp annealing (FLA) has recently been receiving attention as an annealing technique for heating a semiconductor wafer in an extremely short time. The flash lamp annealing is a heat treatment technique for raising the temperature of only a surface of the semiconductor wafer implanted with impurities in an extremely short time (a few milliseconds or less) by irradiating the surface of the semiconductor wafer with flash light using xenon flash lamps (hereinafter, the term "flash lamps" used means xenon flash lamps).

The xenon flash lamps have a spectral distribution of radiation ranging from ultraviolet regions to near-infrared regions. A wavelength of light emitted from the xenon flash lamps is shorter than that of light emitted from conventional halogen lamps and substantially coincides with a fundamental absorption band of a silicon semiconductor wafer. Thus, the temperature of the semiconductor wafer can be rapidly increased with a small amount of transmitted light when the semiconductor wafer is irradiated with flash light from the xenon flash lamps. It has been determined that the irradiation with flash light in an extremely short time of a few milliseconds or less can selectively raise the temperature of only near the surface of the semiconductor wafer. Accordingly, such a temperature rise in an extremely short time using the xenon flash lamps allows impurities to be only activated without being deeply diffused.

In a lamp annealing apparatus including the flash lamps, an O ring is used as a sealing member for making a chamber airtight, the chamber housing the semiconductor wafer. The O ring is made of resin and has a relatively low heat resistance, so that measures to suppress a temperature rise (for example, cooling of the chamber by exploiting cooling fluid) are needed when the O ring is used in a heat treatment apparatus. Particularly in a case where the O ring is used in the heat treatment apparatus including the flash lamps, extremely intense flash light is instantaneously emitted, thereby resulting in degradation of a surface of the O ring due to the irradiation with the intense flash light rather than degradation of the O ring due to heat. The degradation of the surface of the O ring not only causes a loss of airtightness in the chamber but also generation of gas and particles, thereby leading to the serious problems.

For this reason, Japanese Patent Application Laid-Open No. 2009-4427 proposes that a rough surface diffusely reflecting light is formed on a back surface of a clamping ring by sand blasting in an apparatus in which an O ring is sandwiched between a chamber side wall and a quartz window and seals them together by pressing the quartz window against the chamber with the clamping ring. Even if part of flash light travels into the portion between the clamping ring and the chamber side wall during irradiation with the flash light, the light is diffusely reflected by the rough surface on the back surface of the clamping ring. This prevents the light from reaching the O ring, which can prevent the degradation of the O ring.

Flash-lamp annealing apparatus for activating impurities as disclosed in Japanese Patent Application Laid-Open No. 2009-4427 has been used in normal pressure. However, application of flash lamp annealing to different treatment purposes (for example, heat treatment of a high dielectric gate insulating film) has been taken into consideration, and pressure in the chamber may be reduced to a vacuum according to a treatment purpose in some cases. To reduce the pressure in the chamber to a vacuum, the chamber itself needs to have a pressure-resistant structure, and a quartz window that closes the opening of the chamber needs to have a thickness greater than that disclosed in Japanese Patent Application Laid-Open No. 2009-4427.

However, it has been determined that the quartz window having the greater thickness causes an increased amount of flash light traveling into the quartz window during irradiation with flash light and that the degradation of the surface of the O ring cannot be sufficiently prevented by only blasting the back surface of clamping ring because the O ring is exposed to the flash light.

SUMMARY OF THE INVENTION

The present invention is directed to a heat treatment apparatus that irradiates a substrate with flash light to heat the substrate.

In an aspect of the present invention, the heat treatment apparatus includes: a chamber housing a substrate; a retaining portion retaining the substrate in the chamber; a flash lamp provided outside the chamber and on one side of the chamber; a quartz window covering an opening of the one side of the chamber; an O ring sandwiched between a side wall of the chamber and a contact surface of a peripheral portion of the quartz window; and a window holding-down member pressing a counter surface opposed to the contact surface of the peripheral portion of the quartz window against the side wall of the chamber. A light-exposure blocking portion blocking light that is emitted from the flash lamp and travels into the peripheral portion of the quartz window from reaching the O ring is formed in the peripheral portion of the quartz window.

An amount of flash light reaching the O ring during irradiation with flash light is reduced, which can prevent degradation of the O ring due to the irradiation with the flash light.

Preferably, the light-exposure blocking portion is opaque quartz provided in the peripheral portion of the quartz window.

The light-exposure blocking portion is opaque quartz, so that contamination of the inside of the chamber due to the light-exposure blocking portion can be prevented.

The present invention is also directed to a method for manufacturing a heat treatment apparatus that irradiates a substrate with flash light emitted from a flash lamp to heat the substrate, the flash lamp being provided outside a chamber housing the substrate and being provided on one side of the chamber.

In an aspect of the present invention, the method for manufacturing a heat treatment apparatus includes: covering an opening of the one side of the chamber with a quartz window while an O ring is sandwiched between a side wall of the chamber and a peripheral portion of the quartz window; and performing grooving on a surface of the peripheral portion of the quartz window to form a plurality of grooves thereon.

The plurality of grooves block the light traveling into the peripheral portion of the quartz window during irradiation with flash light from reaching the O ring. This reduces an amount of flash light reaching the O ring, which can prevent degradation of the O ring due to the irradiation with the flash light.

In another aspect of the present invention, the method for manufacturing a heat treatment apparatus includes: covering an opening of the one side of the chamber with a quartz window while an O ring is sandwiched between a side wall of the chamber and a peripheral portion of the quartz window; and forming a metal film on a surface of the peripheral portion of the quartz window to form a mirror surface thereon.

The mirror surface blocks the light traveling into the peripheral portion of the quartz window during irradiation with flash light from reaching the O ring. This reduces an amount of flash light reaching the O ring, which can prevent the degradation of the O ring due to the irradiation with the flash light.

In another aspect of the present invention, the method for manufacturing a heat treatment apparatus includes: covering an opening of the one side of the chamber with a quartz window while an O ring is sandwiched between a side wall of the chamber and a peripheral portion of the quartz window; and performing blasting on a surface of the peripheral portion of the quartz window to form a rough surface thereon.

The rough surface blocks the light traveling into the peripheral portion of the quartz window during irradiation with flash light from reaching the O ring. This reduces an amount of flash light reaching the O ring, which can prevent the degradation of the O ring due to the irradiation with the flash light.

In another aspect of the present invention, the method for manufacturing a heat treatment apparatus includes: covering an opening of the one side of the chamber with a quartz window while an O ring is sandwiched between a side wall of the chamber and a peripheral portion of the quartz window; and welding opaque quartz to the peripheral portion of the quartz window.

The opaque quartz blocks the light traveling into the peripheral portion of the quartz window during irradiation with flash light from reaching the O ring. This reduces an amount of flash light reaching the O ring, which can prevent the degradation of the O ring due to the irradiation with the flash light.

The present invention therefore has an object to prevent the degradation of the O ring due to the irradiation with the flash light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal cross-sectional view showing a configuration of a heat treatment apparatus according to the present invention;

FIG. 4 is a side view of the retaining portion when seen from one side;

FIG. 7 is a plan view showing the arrangement of a plurality of halogen lamps;

FIG. 9 is an enlarged view of a plurality of grooves formed on an upper chamber window;

FIG. 11 shows a configuration of a peripheral portion of an upper chamber window in a fourth embodiment;

FIG. 14 shows an example of a structure of a peripheral portion of an upper chamber window in an eighth embodiment;

FIG. 15 shows another example of the structure of the peripheral portion of the upper chamber window in the eighth embodiment;

FIG. 16 shows another example of the structure of the peripheral portion of the upper chamber window in the eighth embodiment;

FIG. 17 shows another example of the structure of the peripheral portion of the upper chamber window in the eighth embodiment;

FIG. 19 shows another example of the structure of the peripheral portion of the upper chamber window in the ninth embodiment;

FIG. 21 shows another example of the structure of the peripheral portion of the upper chamber window in the ninth embodiment;

FIG. 25 shows another example of the structure of the peripheral portion of the upper chamber window in the ninth embodiment.

DESCRIPTION OF EMBODIMENTS

Figure 2:
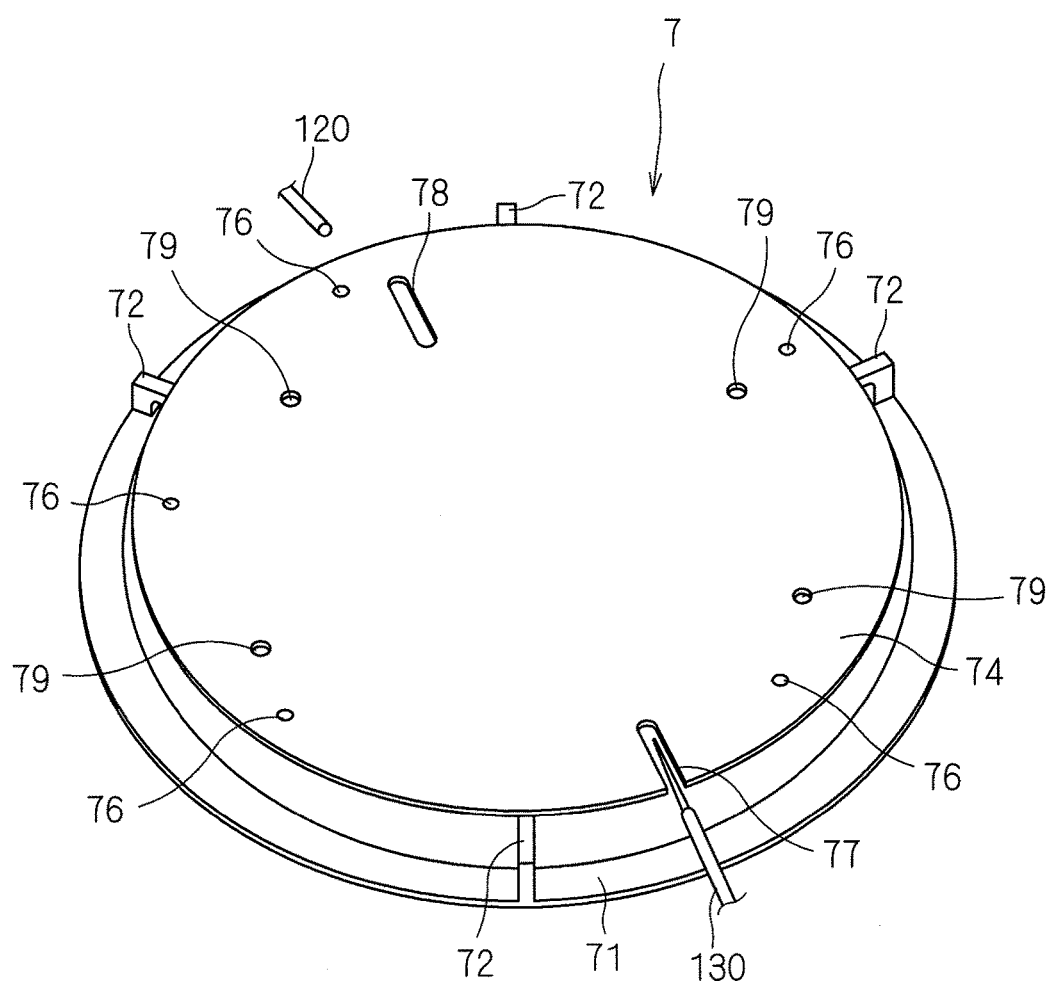
FIG. 2 is a perspective view showing an overall external view of a retaining portion.

The following describes embodiments of the present invention with reference to the drawings.

<First Embodiment>

FIG. 1 is a longitudinal cross-sectional view showing a configuration of a heat treatment apparatus 1 according to the present invention. The heat treatment apparatus 1 in this embodiment is a flash-lamp annealing apparatus that heats a semiconductor wafer W having a disc shape, having a diameter of 300 mm, and serving as a substrate by irradiating the semiconductor wafer W with flash light. To facilitate the understanding, the size and number of each part are exaggerated or simplified as necessary in FIG. 1 and subsequent drawings.

The heat treatment apparatus 1 includes a chamber 6 housing the semiconductor wafer W, a flash heating portion 5 including a plurality of built-in flash lamps FL, and a halogen heating portion 4 including a plurality of built-in halogen lamps HL. The flash heating portion 5 is provided above the chamber 6, and the halogen heating portion 4 is provided below the chamber 6. The heat treatment apparatus 1 also includes, in the chamber 6, a retaining portion 7 retaining the semiconductor wafer W thereon in a horizontal position, and a transfer mechanism 10 transferring the semiconductor wafer W between the retaining portion 7 and the outside of the apparatus. The heat treatment apparatus 1 further includes a controller 3 controlling operating mechanisms each provided in the halogen heating portion 4, the flash heating portion 5, and the chamber 6 to perform heat treatment of the semiconductor wafer W.

The chamber 6 is formed of quartz chamber windows installed on the upper side and the lower side of a chamber side portion 61 having a tubular shape. The chamber side portion 61 has the substantially tubular shape having openings at the top and the bottom. An upper chamber window 63 is installed in the upper opening to close the opening while a lower chamber window 64 is installed in the lower opening to close the opening. The upper chamber window 63, which forms the ceiling portion of the chamber 6, is a disc-shaped member made of quartz and functions as a quartz window through which flash light emitted from the flash heating portion 5 is transmitted into the chamber 6. The lower chamber window 64, which forms the floor portion of the chamber 6, is also a disc-shaped member made of quartz and functions as a quartz window through which light emitted from the halogen heating portion 4 is transmitted into the chamber 6.

The heat treatment apparatus 1 in this embodiment is suitable in a vacuum, and the chamber 6 also has a pressure-resistant structure resistant to a vacuum. Specifically, the upper chamber window 63 and the lower chamber window 64 have thicknesses (of 20 mm or more, for example) greater than those in a conventional flash-lamp annealing apparatus suitable in normal pressure. The O ring is sandwiched between the upper chamber window 63 and the chamber side portion 61, and the O ring is sandwiched between the lower chamber window 64 and the chamber side portion 61, to thereby seal the inside of the chamber 6, which will be further described below.

A reflective ring 68 is mounted on an upper portion of an inner wall surface of the chamber side portion 61, and a reflective ring 69 is mounted on a lower portion thereof. Both of the reflective rings 68, 69 have an annular shape. The upper reflective ring 68 is mounted by being fitted on the chamber side portion 61 from thereabove. On the other hand, the lower reflective ring 69 is mounted by being fitted on the chamber side portion 61 from therebelow and fastened with screws, which are not shown. In other words, the reflective rings 68, 69 are both removably mounted on the chamber side portion 61. The inner space of the chamber 6, namely, the space surrounded by the upper chamber window 63, the lower chamber window 64, the chamber side portion 61, and the reflective rings 68, 69 is defined as a heat treatment space 65.

The reflective rings 68, 69 are mounted on the chamber side portion 61, to thereby form a recessed portion 62 in the inner wall surface of the chamber 6. In other words, the recessed portion 62 is surrounded by the central portion of the inner wall surface of the chamber side portion 61 on which the reflective rings 68, 69 are not mounted, a lower end face of the reflective ring 68, and an upper end face of the reflective ring 69. The recessed portion 62 has an annular shape in a horizontal direction in the inner wall surface of the chamber 6 so as to surround the retaining portion 7 retaining the semiconductor wafer W.

The chamber side portion 61 and the reflective rings 68, 69 are formed of a metal material (for example, stainless steel) having excellent strength and excellent heat resistance. The reflective rings 68, 69 have inner circumferential surfaces mirror-finished by electrolytic nickel plating.

The chamber side portion 61 has a transport opening (throat) 66 formed therein for allowing the semiconductor wafer W to be transported into and out of the chamber 6. The transport opening 66 is configured to be openable and closable by means of a gate valve 185. The transport opening 66 is communicatively connected to an outer circumferential surface of the recessed portion 62. Accordingly, when the transport opening 66 is opened by the gate valve 185, the semiconductor wafer W can be transported into and out of the heat treatment space 65 through the recessed portion 62 from the transport opening 66. When the transport opening 66 is closed by the gate valve 185, the heat treatment space 65 in the chamber 6 is an enclosed space.

A gas supply port 81 supplying treatment gas into the heat treatment space 65 is formed in an upper portion of the inner wall of the chamber 6. The gas supply port 81 is formed at a position above the recessed portion 62 and may be provided in the reflective ring 68. The gas supply port 81 is communicatively connected to a gas supply pipe 83 through a buffer space 82 formed in an annular shape inside the side wall of the chamber 6. The gas supply pipe 83 is connected to a gas supply source 85. A valve 84 is located in a path of the gas supply pipe 83. When the valve 84 is opened, treatment gas is fed from the gas supply source 85 into the buffer space 82. The treatment gas flowing into the buffer space 82 spreads out in the buffer space 82, which has fluid resistance lower than that of the gas supply port 81, and is then supplied into the heat treatment space 65 through the gas supply port 81. The treatment gas may be an inert gas such as argon (Ar), helium (He), and nitrogen ($N_2$) or a reactive gas such as oxygen ($O_2$), hydrogen ($H_2$), chlorine ($Cl_2$), hydrogen chloride (HCl), ozone ($O_3$), and ammonia ($NH_3$).

A gas exhaust port 86 discharging the gas from the heat treatment space 65 is formed in a lower portion of the inner wall of the chamber 6. The gas exhaust port 86 is formed at a position below the recessed portion 62 and may be provided in the reflective ring 69. The gas exhaust port 86 is communicatively connected to a gas exhaust pipe 88 through a buffer space 87 formed in an annular shape inside the side wall of the chamber 6. The gas exhaust pipe 88 is connected to an exhaust portion 190. A valve 89 is located in a path of the gas exhaust pipe 88. When the valve 89 is opened, the gas in the heat treatment space 65 is discharged from the gas exhaust port 86 into the gas exhaust pipe 88 through the buffer space 87. A configuration is also possible in which a plurality of gas supply ports 81 and a plurality of gas exhaust ports 86 are provided in the circumferential direction of the chamber 6, or a configuration is possible in which the gas supply port 81 and the gas exhaust port 86 are slit-shaped.

The exhaust portion 190 includes a vacuum pump. When the valve 84 is closed to stop supplying gas into the heat treatment space 65 and the exhaust portion 190 operates with the valve 89 open, the gas in the heat treatment space 65 is discharged, allowing the pressure in the heat treatment space 65 to be reduced to a vacuum less than atmospheric pressure. On the other hand, when the valve 84 is opened to supply the treatment gas into the heat treatment space 65 and the exhaust portion 190 operates with the valve 89 open, the atmosphere of the heat treatment space 65 can be replaced.

A gas exhaust pipe 191 discharging the gas in the heat treatment space 65 is connected to an end of the transport opening 66. The gas exhaust pipe 191 is connected to the exhaust portion 190 through a valve 192. By opening the valve 192, the gas in the chamber 6 is discharged through the transport opening 66.

Figure 3:
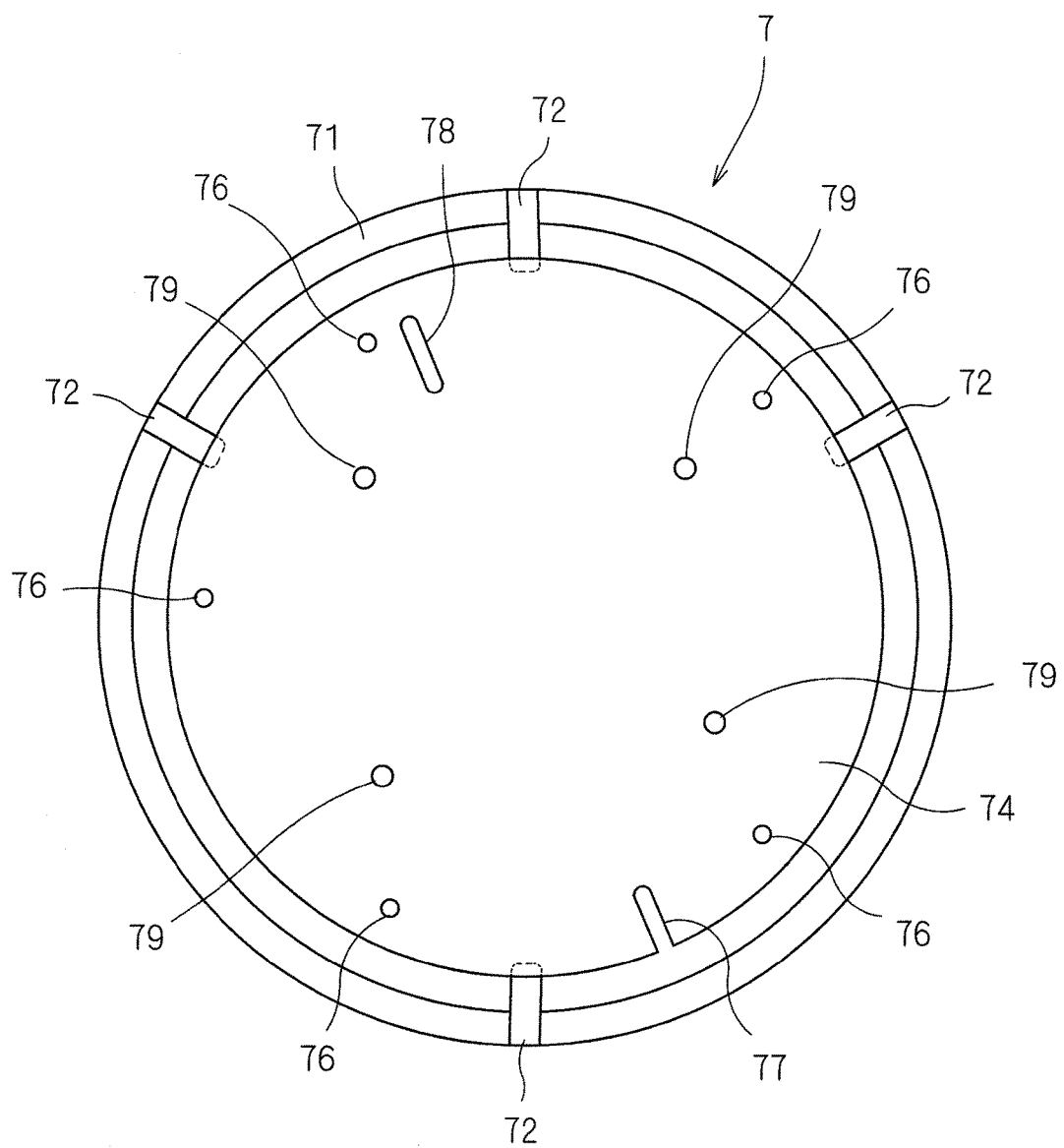
FIG. 3 is a plan view of the retaining portion when seen from above.

FIG. 2 is a perspective view showing an overall external view of the retaining portion 7. FIG. 3 is a plan view of the retaining portion 7 when seen from above. FIG. 4 is a side view of the retaining portion 7 when seen from one side. The retaining portion 7 includes a base ring 71, connecting portions 72, and a susceptor 74. The base ring 71, the connecting portions 72, and the susceptor 74 are each made of quartz. In other words, the entire retaining portion 7 is made of quartz.

The base ring 71 is a quartz member having an annular shape. The base ring 71 is placed on a bottom surface of the recessed portion 62 and thereby supported on the wall surface of the chamber 6 (see FIG. 1). On a top surface of the base ring 71 having the annular shape, the plurality of (in this embodiment, four) connecting portions 72 are provided upright in a circumferential direction of the base ring 71. The connecting portions 72 are also the quartz members and are fixedly attached to the base ring 71 by welding. The base ring 71 may have an arc shape that is an annular shape with a missing part.

The susceptor 74 having a plate shape is supported by the four connecting portions 72 provided on the base ring 71. The susceptor 74 is a member that is made of quartz and has a substantially circular plate shape. The susceptor 74 has a diameter greater than that of the semiconductor wafer W. In other words, the susceptor 74 has a planar size greater than that of the semiconductor wafer W. A plurality of (in this embodiment, five) guide pins 76 are provided upright on a top surface of the susceptor 74. The five guide pins 76 are provided along a circumference of a circle concentric with the outer circumferential circle of the susceptor 74. The diameter of the circle along which the five guide pins 76 are disposed is slightly greater than the diameter of the semiconductor wafer W. Each of the guide pins 76 is also made of quartz. In addition, the guide pins 76 may be integrally processed with the susceptor 74 from a quartz ingot, or the guide pins 76 that are separately processed may be welded to the susceptor 74.

The four connecting portions 72 provided upright on the base ring 71 are fixedly attached to a peripheral portion of a bottom surface of the susceptor 74 by welding. In other words, the connecting portions 72 fixedly connect the susceptor 74 and the base ring 71, and the retaining portion 7 is an integrally molded member of quartz. The base ring 71 of the retaining portion 7 is supported on the wall surface of the chamber 6, and thus the retaining portion 7 is mounted on the chamber 6. While the retaining portion 7 is mounted on the chamber 6, the susceptor 74 having the substantially circular plate shape is in a horizontal position (a position at which the normal coincides with the vertical direction). The semiconductor wafer W transported into the chamber 6 is placed and retained in the horizontal position on the susceptor 74 of the retaining portion 7 mounted on the chamber 6. The semiconductor wafer W is placed inside the circle formed with the five guide pins 76, which prevents the position of the semiconductor wafer W from being shifted in the horizontal direction. In addition, the number of guide pins 76 is not limited to five and may be the number capable of preventing the position of the semiconductor wafer W from being shifted.

As shown in FIGS. 2 and 3, the susceptor 74 has an opening 78 and a notch 77 vertically penetrating the susceptor 74. The notch 77 is provided for allowing the passage of the tip portion of a probe of a contact thermometer 130 including a thermocouple. In contrast, the opening 78 is provided for allowing a radiation thermometer 120 to receive radiation light (infrared light) radiated from a lower surface of the semiconductor wafer W retained by the susceptor 74. Further, the susceptor 74 has four through holes 79 formed therein, the through holes 79 allowing lift pins 12 of the transfer mechanism 10, which will be described below, to penetrate for transferring the semiconductor wafer W.

Figure 5:
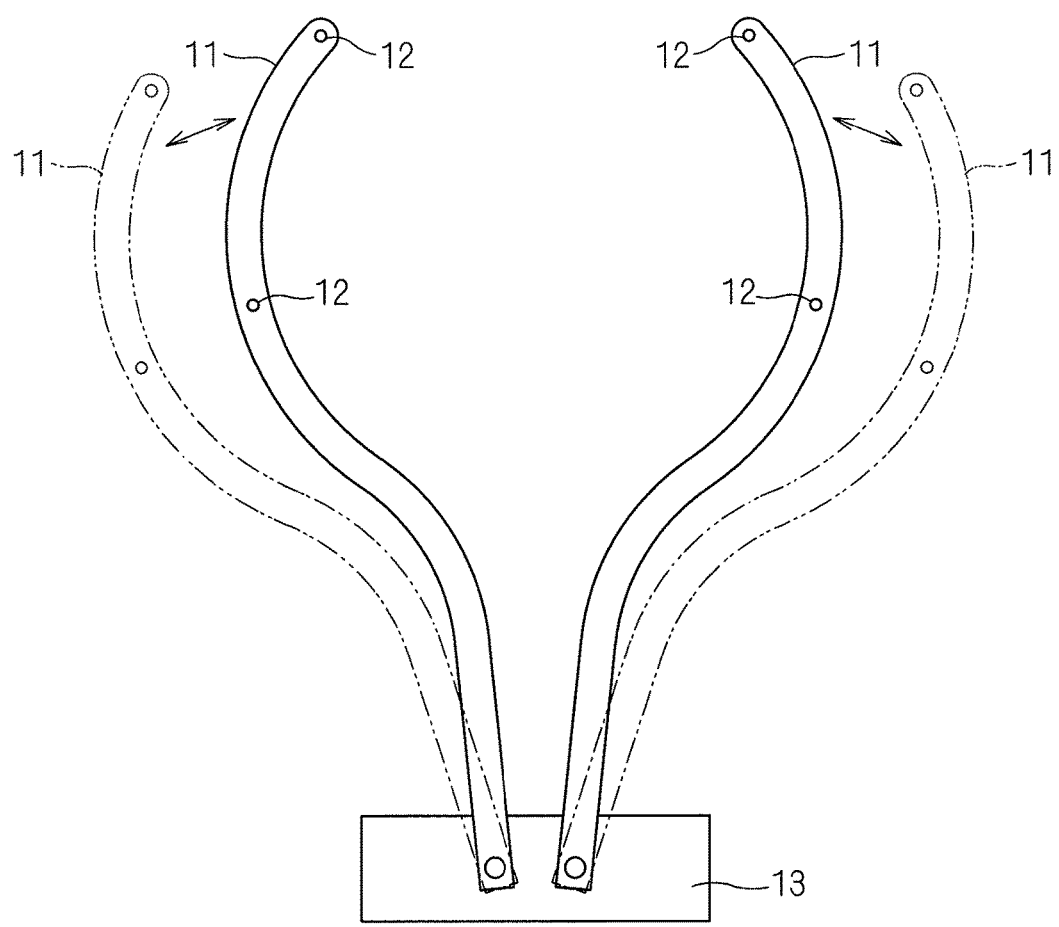
FIG. 5 is a plan view of a transfer mechanism.
Figure 6:
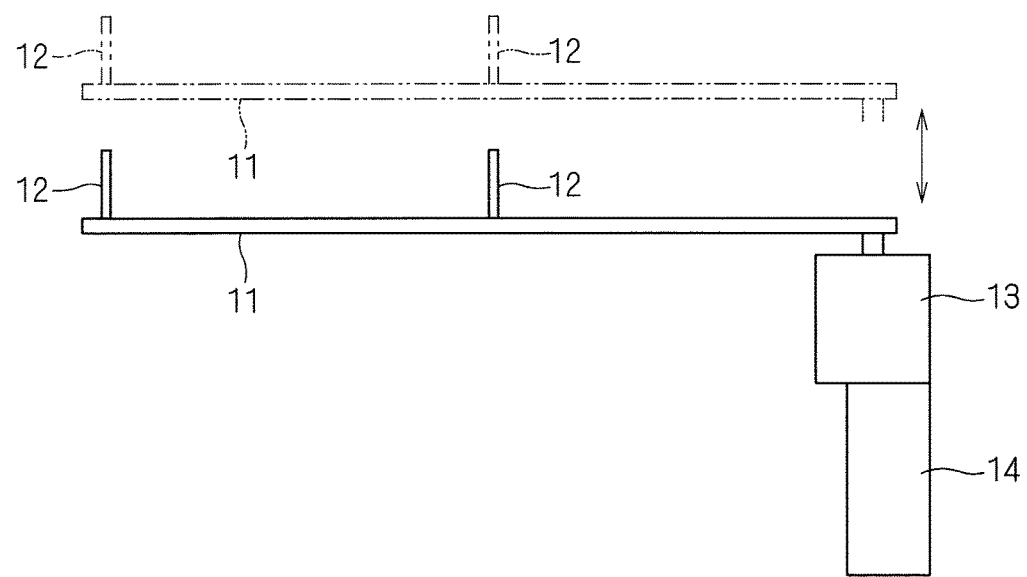
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape so as to fit along the recessed portion 62 having the substantially annular shape. The transfer arms 11 each have the two lift pins 12 provided upright thereon. Each of the transfer arms 11 is configured to be pivotable by a horizontal movement mechanism 13. The horizontal movement mechanism 13 horizontally moves the pair of transfer arms 11 between a transfer operation position (the position indicated by the solid line in FIG. 5) at which the transfer of the semiconductor wafer W to the retaining portion 7 is performed and a retracted position (the position indicated by the dashed double-dotted line in FIG. 5) at which the transfer arms 11 do not overlap the semiconductor wafer W retained on the retaining portion 7 in plan view. The horizontal movement mechanism 13 may be a mechanism for separately pivoting the transfer arms 11 by separate motors, or a mechanism for pivoting the pair of transfer arms 11 in conjunction with each other by a single motor using a link mechanism.

The pair of transfer arms 11 are elevated and lowered together with the horizontal movement mechanism 13 by an elevating mechanism 14. When the elevating mechanism 14 elevates the pair of transfer arms 11 at the transfer operation position, a total of four lift pins 12 pass through the through holes 79 (see FIGS. 2 and 3) formed in the susceptor 74 such that the upper ends of the lift pins 12 protrude from the top surface of the susceptor 74. On the other hand, when the elevating mechanism 14 lowers the pair of transfer arms 11 at the transfer operation position so as to pull the lift pins 12 out of the through holes 79 and the horizontal movement mechanism 13 moves the pair of transfer arms 11 to open the pair of transfer arms 11, each of the transfer arms 11 moves to the retracted position. The retracted position of the pair of transfer arms 11 is located directly above the base ring 71 of the retaining portion 7. The base ring 71 is placed on the bottom surface of the recessed portion 62, so that the retracted position of the transfer arms 11 is located inside the recessed portion 62. An exhaust mechanism, which is not shown, is also provided near the area where driving portions (the horizontal movement mechanism 13 and the elevating mechanism 14) of the transfer mechanism 10 are provided, and the exhaust mechanism discharges the atmosphere around the driving portions of the transfer mechanism 10 to the outside of the chamber 6.

Referring back to FIG. 1, the flash heating portion 5 provided outside and above the chamber 6 includes, inside a housing 51, a light source formed of a plurality of (in this embodiment, 30) xenon flash lamps FL and a reflector 52 provided so as to cover the top of the light source. Moreover, a lamp-light radiation window 53 is attached as the bottom portion of the housing 51 of the flash heating portion 5. The lamp-light radiation window 53 forming the floor portion of the flash heating portion 5 is a plate-like quartz window made of quartz. The flash heating portion 5 is disposed above the chamber 6, so that the lamp-light radiation window 53 and the upper chamber window 63 face each other. The flash lamps FL emit flash light to the heat treatment space 65 from above the chamber 6 through the lamp-light radiation window 53 and the upper chamber window 63.

The plurality of flash lamps FL are rod-shaped lamps each having an elongated cylindrical shape and are arranged in a planar array such that the longitudinal directions of the flash lamps FL are parallel to each other along a main surface of the semiconductor wafer W retained by the retaining portion 7 (namely, in the horizontal direction). Thus, the plane formed by the array of the flash lamps FL is also a horizontal plane.

The xenon flash lamps FL each include a rod-shaped glass tube (discharge tube) and a trigger electrode provided on the outer circumferential surface of the glass tube, the glass tube containing xenon gas sealed therein and including an anode and a cathode that are disposed at opposite ends of the glass tube and are connected to a capacitor. The xenon gas is an electrical insulating material, and thus no electricity passes through the glass tube in a normal state even if electric charge is stored in the capacitor. However, in a case where a high voltage is applied to the trigger electrode to cause an electrical breakdown, the electricity stored in the capacitor instantaneously flows through the glass tube, and xenon atoms or xenon molecules are excited at this time to cause light emission. The xenon flash lamps FL have the properties of being capable of emitting extremely intense light as compared with a continuously lit light source such as the halogen lamps HL because the electrostatic energy previously stored in the capacitor is converted into an extremely short optical pulse of 0.1 millisecond to 100 milliseconds. In other words, the flash lamps FL are pulse light-emitting lamps that instantaneously emit light in an extremely short time of less than a second. In addition, light emission time of the flash lamps FL can be adjusted by a coil constant of a lamp power supply that supplies power to the flash lamps FL.

The reflector 52 is provided above the plurality of flash lamps FL so as to cover all of the flash lamps FL. A basic function of the reflector 52 is to reflect the flash light emitted from the plurality of flash lamps FL toward the heat treatment space 65. The reflector 52 is formed of a plate made of an aluminum alloy, and the surface (surface facing the flash lamps FL) of the reflector 52 is roughened by blasting.

The halogen heating portion 4 provided outside and below the chamber 6 includes a plurality of (in this embodiment, 40) halogen lamps HL inside a housing 41. The halogen heating portion 4 is a light emitting portion in which the plurality of halogen lamps HL emit halogen light to the heat treatment space 65 from below the chamber 6 through the lower chamber window 64 to heat the semiconductor wafer W.

FIG. 7 is a plan view showing the arrangement of the plurality of halogen lamps HL. The plurality of halogen lamps HL are disposed in a region larger than the main surface (namely, a circle having a diameter of 300 mm) of the semiconductor wafer W that has the circular plate shape and is retained by the retaining portion 7. Moreover, the plurality of halogen lamps HL are disposed in the region opposed to a lower surface of the main surface of the semiconductor wafer W.

As shown in FIGS. 1 and 7, 40 halogen lamps HL are divided into two rows so as to be disposed in an upper row and a lower row. 20 halogen lamps HL are disposed in the upper row close to the retaining portion 7, and 20 halogen lamps HL are disposed in the lower row farther from the retaining portion 7 than the upper row. Each of the halogen lamps HL is a rod-shaped lamp having an elongated cylindrical shape. The 20 halogen lamps HL in each of the upper row and the lower row are arranged such that their longitudinal directions are parallel to each other along the main surface of the semiconductor wafer W retained by the retaining portion 7 (namely, in the horizontal direction). Thus, the plane formed by the array of the halogen lamps HL in the upper row and the plane formed by the array of the halogen lamps HL in the lower row are both horizontal planes.

As shown in FIG. 7, in each of the upper row and the lower row, the halogen lamps HL are disposed at a higher density in a region opposed to the peripheral portion of the semiconductor wafer W retained by the retaining portion 7 than in a region opposed to the central portion thereof. In other words, in each of the upper row and the lower row, the halogen lamps HL are disposed at a shorter pitch in the peripheral portion of the array of the halogen lamps than in the central portion thereof. This allows a greater amount of light to be applied to the peripheral portion of the semiconductor wafer W in which the temperature tends to drop during heating by the irradiation with light from the halogen heating portion 4.

A lamp group of the halogen lamps HL in the upper row and a lamp group of the halogen lamps HL in the lower row are arranged so as to intersect each other in the grid pattern. In other words, a total of 40 halogen lamps HL are disposed such that the longitudinal direction of the 20 halogen lamps HL in the upper row and the longitudinal direction of the 20 halogen lamps HL in the lower row are orthogonal to each other.

The halogen lamps HL are each a filament light source that passes current through a filament disposed in the glass tube to make the filament incandescent and cause light emission. The glass tube contains a gas sealed therein, the gas being prepared by introducing a halogen element (such as iodine and bromine) in trace amounts into an inert gas such as nitrogen and argon. The introduction of the halogen element allows the temperature of the filament to be set at a high temperature while suppressing breakage of the filament. Therefore, the halogen lamps HL have the properties of having a longer life than typical incandescent lamps and being capable of continuously emitting intense light. In other words, the halogen lamps HL are each a continuously lit lamp that continuously emits light for at least a second or longer. The halogen lamps HL that are the rod-shaped lamps have a long life, and disposing the halogen lamps HL in the horizontal direction enhances the efficiency of radiation to the semiconductor wafer W located above the halogen lamps HL.

The housing 41 of the halogen heating portion 4 also includes a reflector 43 provided below the halogen lamps HL in the two rows (FIG. 1). The reflector 43 reflects the light emitted from the plurality of halogen lamps HL toward the heat treatment space 65.

Figure 8:
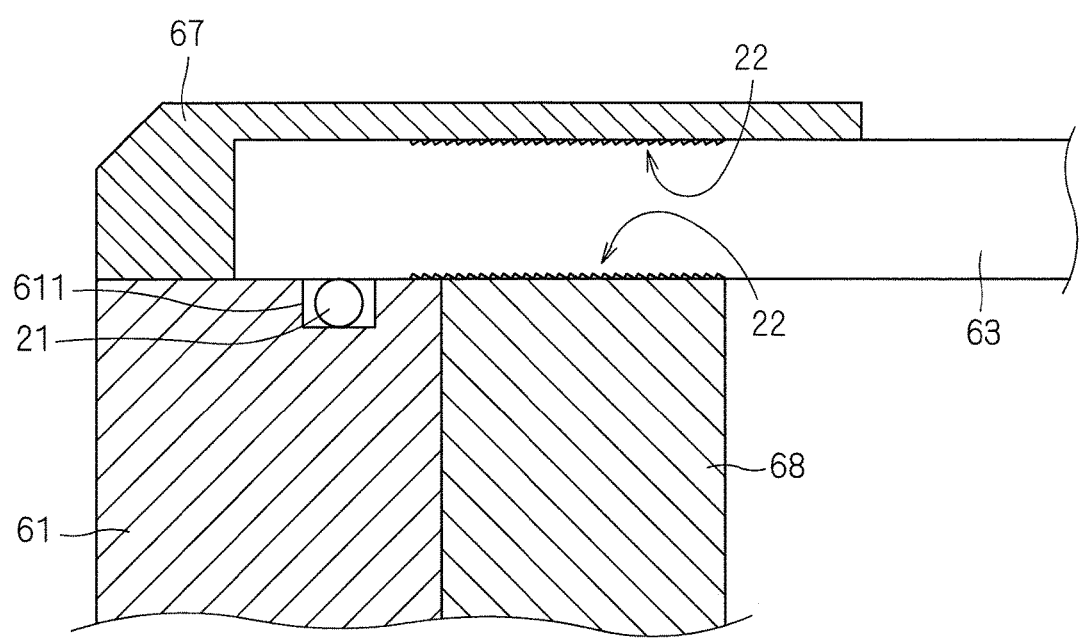
FIG. 8 is a partial enlarged view of a configuration around a sealing portion of a chamber.

FIG. 8 is a partial enlarged view of a configuration around a sealing portion of the chamber 6. To maintain the airtightness of the heat treatment space 65 in the chamber 6, the upper chamber window 63 and the chamber side portion 61 are sealed with an O ring 21. The O ring 21 is made of resin having excellent heat resistance, for example, white Viton (registered trade mark). A groove 611 having an annular shape is formed in the upper end of the chamber side portion 61 having the substantially tubular shape, and the O ring 21 is fitted into the groove 611. A diameter of the section of the O ring 21 is greater than a depth of the groove 611. Then, the upper chamber window 63 is placed on the O ring 21 fitted into the groove 611 to press down the O ring 21. Further, a clamping ring 67 contacts the upper peripheral portion of the upper chamber window 63 and is fixed to the chamber side portion 61 with screws, so that the peripheral portion of the upper chamber window 63 is pressed against the upper end portion of the chamber side portion 61 from above. Accordingly, the lower peripheral portion of the upper chamber window 63 and the upper end portion of the chamber side portion 61 sandwich the O ring 21 therebetween and bring the O ring 21 into close contact therewith. The upper chamber window 63 is pressed down with the clamping ring 67, to thereby seal the upper opening of the chamber 6 with the O ring 21. The clamping ring 67 is made of aluminum having excellent resistance to flash light from the flash lamps FL. In addition, similarly to the upper opening, the lower chamber window 64 and the chamber side portion 61 sandwich an O ring (not shown) therebetween, to thereby seal the lower opening of the chamber 6.

In the first embodiment, grooving is performed on surfaces of the peripheral portion of the upper chamber window 63, to thereby form a plurality of grooves 22 on the surface thereof. Specifically, the plurality of grooves 22 are formed on a lower surface (namely, a contact surface contacting the O ring 21) of the peripheral portion of the upper chamber window 63, and the plurality of grooves 22 are formed on an upper surface (namely, a counter surface opposed to the contact surface) of the peripheral portion of the upper chamber window 63. In addition, the surface of the peripheral portion of the upper chamber window 63 includes the upper surface (counter surface), the lower surface (contact surface), and a side surface (end face to the left of the paper plane in FIG. 8) of the peripheral portion thereof.

The plurality of grooves 22 may be formed on the entire surface of the contact surface and the counter surface of the peripheral portion of the upper chamber window 63, which is not necessary. It suffices that the plurality of grooves 22 are formed on at least part of the region. In this embodiment that treats the semiconductor wafer W having the diameter of 300 mm, the plurality of grooves 22 are formed in, for example, the region of the upper surface and the lower surface of the upper chamber window 63, the region having an annular strip shape and having a diameter of 215 to 260 mm. Note that the grooves 22 are not preferably formed on at least an area, which contacts the O ring 21, of the peripheral portion of the upper chamber window 63. In other words, the plurality of grooves 22 are preferably formed in the region of the contact surface of the peripheral portion of the upper chamber window 63 except for the area contacting the O ring 21. The reason is that sealing properties are impaired if the grooves 22 are formed on the area, which contacts the O ring 21, of the contact surface of the upper chamber window 63. In addition, grooves may be formed on the area, which contacts the O ring 21, of the contact surface of the peripheral portion of the upper chamber window 63 after sealing properties are assured by making the size and the shape of the grooves on the area contacting the O ring 21 to fit with a curved surface of the O ring 21.

FIG. 9 is an enlarged view of the plurality of grooves 22 formed on the upper chamber window 63. The plurality of grooves 22 are formed on the contact surface and the counter surface of the peripheral portion of the upper chamber window 63 such that each of the grooves 22 is an annular right-triangle in section. In this embodiment, each of the grooves 22 is formed such that a side of the right triangle in section forms an angle $\alpha$ of 60° with respect to the horizontal plane. The plurality of grooves 22 can each have any size (depth).

Referring back to FIG. 1, a controller 3 controls the above-described various operating mechanisms provided in the heat treatment apparatus 1. The controller 3 has a similar hardware configuration to that of a commonly used computer. More specifically, the controller 3 includes a CPU being a circuit for executing various types of computation processing, a ROM being a read-only memory for storing a basic program, a RAM being a readable and writable memory for storing various pieces of information, and a magnetic disk for storing control software and data. The CPU of the controller 3 executes a predetermined processing program, and thus the processing in the heat treatment apparatus 1 proceeds.

The heat treatment apparatus 1 includes, in addition to the above-described components, various cooling structures to prevent an excessive temperature increase in the halogen heating portion 4, the flash heating portion 5, and the chamber 6 due to thermal energy generated from the halogen lamps HL and the flash lamps FL during the heat treatment of the semiconductor wafer W. For example, the chamber 6 includes a water-cooled tube (not shown) in the wall. This also cools the O ring 21 fitted into the groove 611 of the chamber side portion 61. The halogen heating portion 4 and the flash heating portion 5 have an air-cooling structure that forms a flow of gas therein to discharge heat. Air is also supplied to a gap between the upper chamber window 63 and the lamp-light radiation window 53 to cool the flash heating portion 5 and the upper chamber window 63.

Next, a procedure for the treatment of the semiconductor wafer W in the heat treatment apparatus 1 having the above-described configuration is simply described. While the semiconductor wafer W to be treated in the heat treatment apparatus 1 in this embodiment is not limited to a particular type, the semiconductor wafer W includes a Hf-based high dielectric gate insulating film (high-k film) formed on the surface thereof, for example. The procedure for the treatment of the heat treatment apparatus 1 described below proceeds as the controller 3 controls each of the operating mechanisms in the heat treatment apparatus 1.

First, the valve 84 for supplying gas is opened and the valves 89, 192 for discharging gas are opened, thereby starting gas supply and exhaust into and from the chamber 6. When the valve 84 is opened, nitrogen gas is supplied from the gas supply port 81 into the heat treatment space 65. When the valve 89 is opened, the gas in the chamber 6 is discharged from the gas exhaust port 86. Accordingly, the nitrogen gas supplied from above the heat treatment space 65 in the chamber 6 flows downward and is discharged from below the heat treatment space 65. Then, the heat treatment space 65 is replaced with the atmosphere of the nitrogen gas. When the valve 192 is opened, the gas in the chamber 6 is also discharged from the transport opening 66. Further, the atmosphere around the driving portions of the transfer mechanism 10 is also discharged from an exhaust mechanism, which is not shown.

Subsequently, the gate valve 185 is opened to open the transport opening 66, and the semiconductor wafer W to be treated is transported into the heat treatment space 65 through the transport opening 66 by a transport robot outside the apparatus. The semiconductor wafer W transported by the transport robot is stopped after moved to a position directly above the retaining portion 7. Then, the pair of transfer arms 11 of the transfer mechanism 10 are moved horizontally from the retracted position to the transfer operation position and are elevated, and thus the lift pins 12 protrude from the top surface of the susceptor 74 through the through holes 79 so as to receive the semiconductor wafer W.

After the semiconductor wafer W is placed on the lift pins 12, the transfer robot is withdrawn from the heat treatment space 65, and the gate valve 185 closes the transport opening 66. Then, the pair of the transfer arms 11 are lowered, so that the semiconductor wafer W is transferred from the transfer mechanism 10 to the susceptor 74 of the retaining portion 7 and is retained in the horizontal position from below by the susceptor 74. The semiconductor wafer W is retained inside the five guide pins 76 on the top surface of the susceptor 74. The pair of transfer arms 11 lowered below the susceptor 74 are retracted to the retracted position, namely, the inside of the recessed portion 62, by the horizontal movement mechanism 13. After the semiconductor wafer W is transported into the chamber 6 and the transport opening 66 is closed, the exhaust portion 190 operates with the valve 84 closed to reduce the pressure in the heat treatment space 65 to less than atmospheric pressure. Subsequently, a reactive gas such as ammonia may be additionally supplied to the heat treatment space 65 from the gas supply source 85.

After the semiconductor wafer W is retained in the horizontal position from below by the retaining portion 7 made of quartz, the 40 halogen lamps HL of the halogen heating portion 4 turn on all at once to start preheating (assist-heating). The halogen light emitted from the halogen lamps HL transmits through the lower chamber window 64 and the susceptor 74 made of quartz and is applied to the back surface of the semiconductor wafer W. By receiving the light from the halogen lamps HL, the semiconductor wafer W is preheated and raised in temperature. In addition, the transfer arms 11 of the transfer mechanism 10 are retracted inside the recessed portion 62, so that the transfer arms 11 do not obstruct the heating with the halogen lamps HL.

For the preheating with the halogen lamps HL, the contact thermometer 130 measures the temperature of the semiconductor wafer W. More specifically, the contact thermometer 130 including the thermocouple contacts the lower surface of the semiconductor wafer W retained by the retaining portion 7 through the notch 77 of the susceptor 74 and measures the temperature of the wafer during a rise in temperature. The measured temperature of the semiconductor wafer W is transmitted to the controller 3. The controller 3 monitors whether the temperature of the semiconductor wafer W raised in temperature by the irradiation with the light from the halogen lamps HL has reached a predetermined preheating temperature T1. The preheating temperature T1 is set to approximately 200 to 800° C., at which there is no possibility that the impurities doped in the semiconductor wafer W are diffused by heat, and preferably, approximately 350 to 600° C. (in this embodiment, 600° C.). In addition, the radiation thermometer 120 is not used for measuring a temperature when the semiconductor wafer W is raised in temperature by the irradiation with the light from the halogen lamps HL. The reason is that the halogen light emitted from the halogen lamps HL is incident as disturbance light on the radiation thermometer 120, and the temperature thus fails to be measured accurately.

After the temperature of the semiconductor wafer W has reached the preheating temperature T1, the controller 3 temporarily maintains the semiconductor wafer W at the preheating temperature T1. Specifically, the controller 3 performs feedback control on the output of the halogen lamps HL such that the temperature of the semiconductor wafer W measured by the contact thermometer 130 is maintained at the preheating temperature T1.

Such preheating with the halogen lamps HL allows the entire semiconductor wafer W to be uniformly heated to the preheating temperature T1. In the preheating step with the halogen lamps HL, the temperature of the semiconductor wafer W tends to decrease more significantly in the peripheral portion where heat dissipation is more likely to occur than in the central portion. However, the halogen lamps HL of the halogen heating portion 4 are disposed at a higher density in the region opposed to the peripheral portion of the semiconductor wafer W than in the region opposed to the central portion thereof. This allows a greater amount of light to be applied to the peripheral portion of the semiconductor wafer W in which the heat dissipation tends to occur, and thus an in-plane temperature distribution of the semiconductor wafer W in the preheating step can be made uniform. Furthermore, the mirror-finished inner circumferential surface of the reflective ring 69 mounted on the chamber side portion 61 reflects the greater amount of light toward the peripheral portion of the semiconductor wafer W, and thus the in-plane temperature distribution of the semiconductor wafer W in the preheating step can be made more uniform.

At the point in time when a predetermined time has passed since the temperature of the semiconductor wafer W had reached the preheating temperature T1, the flash lamps FL of the flash heating portion 5 emit the flash light to the surface of the semiconductor wafer W. At this time, part of the flash light emitted from the flash lamps FL travels directly into the chamber 6 while another part of the flash light is reflected by the reflector 52 and then travels into the chamber 6. Flash heating of the semiconductor wafer W is performed by the irradiation with the flash light.

The flash heating is performed by the flash light emitted from the flash lamps FL, so that a temperature of the surface of the semiconductor wafer W can be increased in a short time. More specifically, the flash light emitted from the flash lamps FL is extremely short intense flash light that results from the conversion of the electrostatic energy previously stored in the capacitor into an extremely short optical pulse and whose irradiation time is approximately longer than or equal to 0.1 millisecond and shorter than or equal to 100 milliseconds. The temperature of the surface of the semiconductor wafer W subjected to the flash heating by the flash light emitted from the flash lamps FL instantaneously rises to a processing temperature T2 higher than or equal to 1000° C., and then the temperature rapidly drops.

The halogen lamps HL turn off after a predetermine time has passed since the completion of the flash heating treatment. As a result, the temperature of the semiconductor wafer W rapidly decreases from the preheating temperature T1. The temperature of the semiconductor wafer W during a drop in temperature is measured by the contact thermometer 130 or the radiation thermometer 120, and the measurement result is transmitted to the controller 3. The controller 3 monitors whether the temperature of the semiconductor wafer W has decreased to a predetermined temperature from the measurement result. After the temperature of the semiconductor wafer W has decreased lower than or equal to the predetermined temperature, the pair of transfer arms 11 of the transfer mechanism 10 are moved horizontally from the retracted position to the transfer operation position again and are elevated. Thus, the lift pins 12 protrude from the top surface of the susceptor 74 so as to receive the heat-treated semiconductor wafer W from the susceptor 74. Subsequently, the transport opening 66, which has been closed by the gate valve 185, is opened, and the semiconductor wafer W placed on the lift pins 12 is transported by the transport robot outside the apparatus. The heat treatment of the semiconductor wafer W in the heat treatment apparatus 1 is completed. In addition, if the semiconductor wafer W is heat-treated in an atmosphere of the reactive gas such as ammonia, the transport opening 66 is preferably opened after the heat treatment space 65 is replaced with the atmosphere of the nitrogen gas.

When the flash light is emitted from the flash lamps FL in the heat treatment apparatus 1, the flash light reflected diffusely by the inner wall surface or the like of the chamber 6 sometimes travels into the peripheral portion of the upper chamber window 63. Particularly in the heat treatment apparatus 1 of this embodiment suitable in a vacuum, a greater amount of flash light travels into the peripheral portion of the upper chamber window 63 during irradiation with the flash light because the upper chamber window 63 and the lower chamber window 64 have a thickness greater than that in a conventional flash-lamp annealing apparatus suitable in normal pressure. The lower chamber window 64 is disposed opposite to the flash lamps FL with the semiconductor wafer W retained by the retaining portion 7 sandwiched between the lower chamber window 64 and the flash lamps FL, so that the flash light hardly reaches the lower chamber window 64 even during irradiation with the flash light.

In a case where the upper chamber window 63 of quartz is not particularly processed, multiple reflection of the flash light traveling into the peripheral portion of the upper chamber window 63 repeatedly occurs on the surface of the peripheral portion, and then the flash light reaches the O ring 21. When the O ring 21 of resin is exposed to intense flash light, the surface of the O ring 21 is degraded, which not only results in reduced airtightness in the chamber 6 but also the possibility of generation of gas and particles.

Thus, in the first embodiment, the plurality of grooves 22 are formed on the contact surface and the counter surface of the peripheral portion of the upper chamber window 63. Since the plurality of grooves 22 are formed on the contact surface and the counter surface of the peripheral portion of the upper chamber window 63, the flash light traveling into the peripheral portion of the upper chamber window 63 during irradiation with flash light is reflected by the plurality of grooves 22 and does not travel toward the O ring 21. This significantly reduces an amount of flash light reaching the O ring 21. In other words, the plurality of grooves 22 formed on the surfaces of the peripheral portion of the upper chamber window 63 block the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light. In this embodiment, a side of the right triangle in section of each of the grooves 22 forms an angle α of 60° with respect to the horizontal plane, but a freely-selected angle α is preferably set according to a position in which the plurality of grooves 22 are provided and size of the upper chamber window 63 such that the light traveling into the peripheral portion of the upper chamber window 63 does not travel toward the O ring 21.

<Second Embodiment>

Next, a second embodiment of the present invention is described. A heat treatment apparatus in the second embodiment has almost the same overall configuration as that in the first embodiment. A procedure for treatment of a semiconductor wafer W in the second embodiment is also the same as that in the first embodiment. The difference between the second embodiment and the first embodiment is that the second embodiment includes the plurality of grooves 22 of the first embodiment on which a metal film is formed to form mirror surfaces.

In the second embodiment, the metal film is formed on the plurality of grooves 22 by, for example, sputtering, the grooves 22 being formed on the contact surface and the counter surface of the peripheral portion of the upper chamber window 63. The plurality of grooves 22 are formed in the similar manner as that in the first embodiment (see FIGS. 8 and 9). Chromium (Cr), nickel (Ni), and titanium (Ti), for example, may be used as a material for the metal film. If the surface forming each of the plurality of grooves 22 is a smooth surface, the interface between the metal film formed on the smooth surface and the groove 22 is a mirror surface.

Since the mirror surfaces are formed on the plurality of grooves 22, the flash light traveling into the peripheral portion of the upper chamber window 63 during irradiation with flash light is reliably reflected by the plurality of grooves 22 and is prevented from traveling toward the O ring 21. This more significantly reduces an amount of flash light reaching the O ring 21. In other words, the mirror surfaces are formed on the plurality of grooves 22 formed on the surfaces of the peripheral portion of the upper chamber window 63, to thereby reliably block the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

<Third Embodiment>

Next, a third embodiment of the present invention is described. A heat treatment apparatus in the third embodiment has almost the same overall configuration as that in the first embodiment. A procedure for treatment of a semiconductor wafer W in the third embodiment is also the same as that in the first embodiment. The difference between the third embodiment and the first embodiment is that instead of the plurality of grooves 22 formed on the surfaces of the peripheral portion of the upper chamber window 63 in the first embodiment, a mirror surface is formed on a surface of the peripheral portion of the upper chamber window 63 in the third embodiment.

Figure 10:
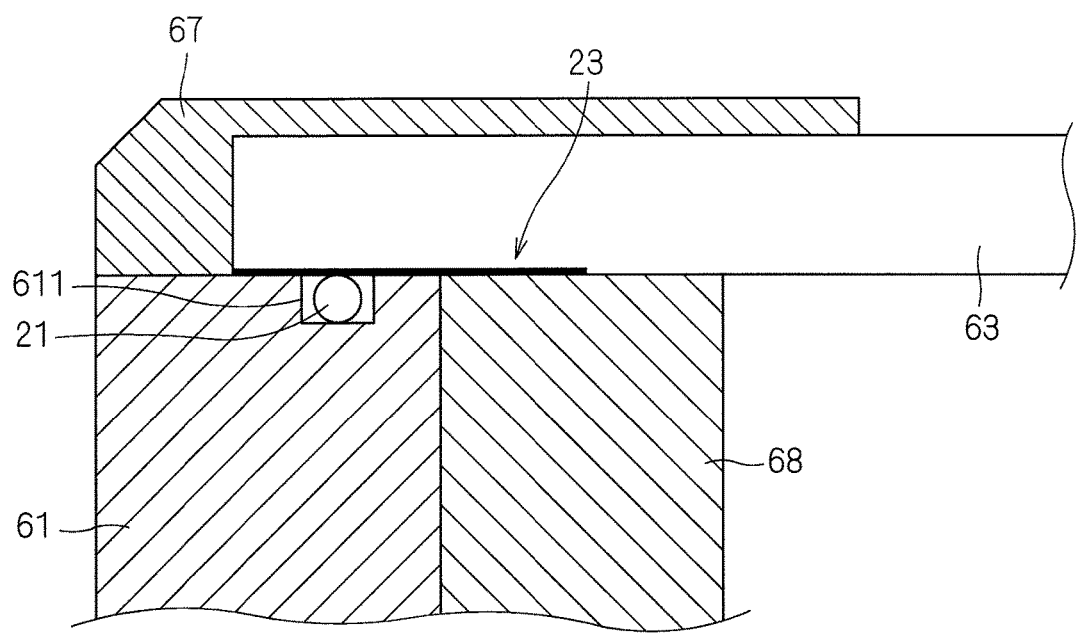
FIG. 10 shows a configuration of a peripheral portion of an upper chamber window in a third embodiment.

FIG. 10 shows a configuration of the peripheral portion of the upper chamber window 63 in the third embodiment. In FIG. 10, the same components as those in the first embodiment (FIG. 8) are denoted by the same references. In the third embodiment, a contact surface (lower surface) of the peripheral portion of the upper chamber window 63 on which a metal film is formed is a mirror surface 23. The surface of the peripheral portion of the upper chamber window 63 of quartz is a smooth surface. The metal film is formed on the smooth surface by, for example, sputtering. Any materials including chromium (Cr), nickel (Ni), and titanium (Ti), for example, may be used for the metal film being formed. Note that metal materials such as copper (Cu), which may also be used as a material for wiring of the semiconductor wafer W to be treated, are unsuitable. When the metal film is formed on the smooth surface of the peripheral portion of the upper chamber window 63, the interface between the metal film and the peripheral portion is a mirror surface. In this manner, the mirror surface 23 can be formed on the contact surface of the peripheral portion of the upper chamber window 63. The mirror surface 23 being formed has a reflectance of greater than or equal to 90%.

The mirror surface 23 is not necessarily formed on the entire surface of the contact surface of the peripheral portion of the upper chamber window 63, and may be formed on part of the region including at least the area contacting the O ring 21. The surface (surface opposite to the interface between the upper chamber window 63 and the mirror surface 23) of the mirror surface 23 is a smooth surface, so that sealing properties are maintained even if the mirror surface 23 is formed on the area contacting the O ring 21.

Since the mirror surface 23 is formed on the contact surface of the peripheral portion of the upper chamber window 63, the flash light traveling into the peripheral portion of the upper chamber window 63 during irradiation with flash light is reflected by the mirror surface 23 and is prevented from traveling toward the O ring 21. This significantly reduces an amount of flash light reaching the O ring 21. In other words, the mirror surface 23 formed on the surface of the peripheral portion of the upper chamber window 63 reliably blocks the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

<Fourth Embodiment>

Next, a fourth embodiment of the present invention is described. A heat treatment apparatus in the fourth embodiment has almost the same overall configuration as that in the first embodiment. A procedure for treatment of a semiconductor wafer W in the fourth embodiment is also the same as that in the first embodiment. The difference between the fourth embodiment and the first embodiment is that instead of the plurality of grooves 22 formed on the surfaces of the peripheral portion of the upper chamber window 63 in the first embodiment, mirror surfaces are formed on surfaces of the peripheral portion of the upper chamber window 63 in the fourth embodiment.

FIG. 11 shows a configuration of the peripheral portion of the upper chamber window 63 in the fourth embodiment. In FIG. 11, the same components as those in the first embodiment (FIG. 8) are denoted by the same references. Also in the fourth embodiment similarly to the third embodiment, the surfaces of the peripheral portion of the upper chamber window 63 on which the metal film is formed are mirror surfaces 23. In the third embodiment, only the contact surface of the peripheral portion of the upper chamber window 63 is the mirror surface 23, whereas the entire surface, namely, a contact surface (lower surface), a counter surface (upper surface), and an end face, of the peripheral portion of the upper chamber window 63 on which the metal film is formed are the mirror surfaces 23 in the fourth embodiment. The surfaces of the peripheral portion of the upper chamber window 63 of quartz are smooth surfaces. The metal film is formed on the smooth surfaces by, for example, sputtering. Any materials may be used for the metal film being formed similarly to the third embodiment. When the metal film is formed on the smooth surfaces of the peripheral portion of the upper chamber window 63, the interface between the metal film and the peripheral portion is a mirror surface. In this manner, the mirror surfaces 23 can be formed on the contact surface, the counter surface, and the end face of the peripheral portion of the upper chamber window 63. In other words, it can be said that the mirror surfaces 23 in the fourth embodiment also include, in addition to the mirror surface 23 in the third embodiment, the counter surface and the end face of the peripheral portion of the upper chamber window 63 on which the metal film is formed. The mirror surfaces 23 being formed have a reflectance of greater than or equal to 90%.

The mirror surfaces 23 are not necessarily formed on the entire surface of the contact surface, the counter surface, and the end face of the peripheral portion of the upper chamber window 63, and may be formed on part of the region including at least the area contacting the O ring 21.

Since the mirror surfaces 23 are formed on the contact surface, the counter surface, and the end face of the peripheral portion of the upper chamber window 63, the flash light traveling into the peripheral portion of the upper chamber window 63 during irradiation with flash light is reflected by the mirror surfaces 23 and reflected back to the heat treatment space 65 again. Consequently, the flash light traveling into the peripheral portion of the upper chamber window 63 is prevented from traveling toward the O ring 21, thereby significantly reducing an amount of flash light reaching the O ring 21. In other words, the mirror surfaces 23 formed on the surfaces of the peripheral portion of the upper chamber window 63 block the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

<Fifth Embodiment>

Next, a fifth embodiment of the present invention is described. A heat treatment apparatus in the fifth embodiment has almost the same overall configuration as that in the first embodiment. A procedure for treatment of a semiconductor wafer W in the fifth embodiment is also the same as that in the first embodiment. The difference between the fifth embodiment and the first embodiment is that instead of the plurality of grooves 22 formed on the surfaces of the peripheral portion of the upper chamber window 63 in the first embodiment, a rough surface is formed on a surface of the peripheral portion of the upper chamber window 63 in the fifth embodiment.

Figure 12:
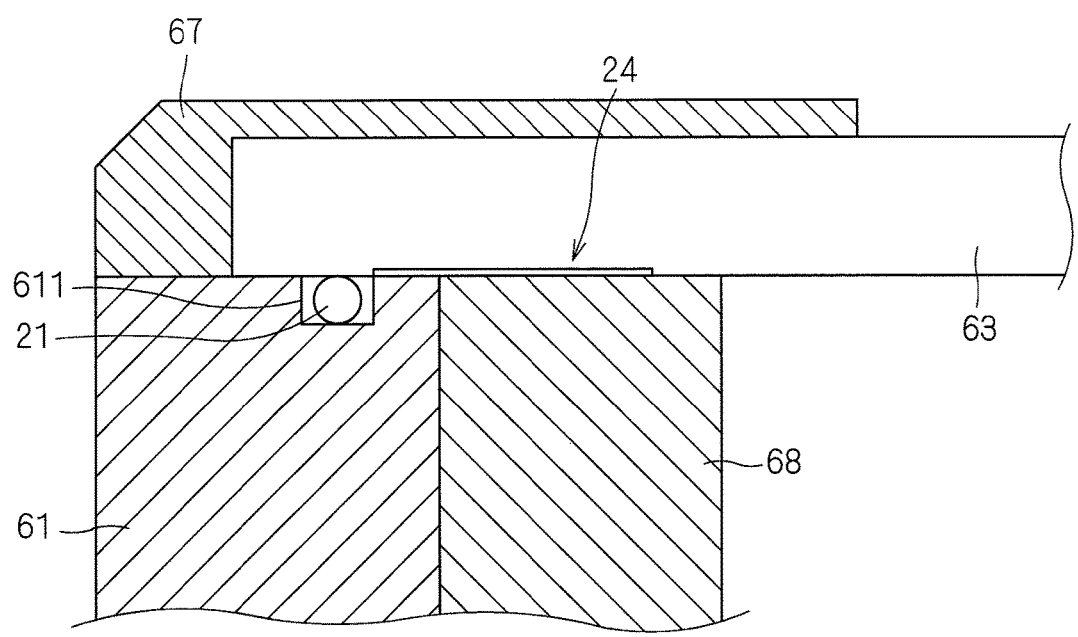
FIG. 12 shows a configuration of a peripheral portion of an upper chamber window in a fifth embodiment.

FIG. 12 shows a configuration of the peripheral portion of the upper chamber window 63 in the fifth embodiment. In FIG. 12, the same components as those in the first embodiment (FIG. 8) are denoted by the same references. In the fifth embodiment, a contact surface (lower surface) of the peripheral portion of the upper chamber window 63 on which blasting is performed is a rough surface 24. Specifically, blasting that sprays, for example, fine particles mixed in compressed air onto the contact surface of the peripheral portion of the upper chamber window 63 allows surface grinding of the contact surface, thereby forming the rough surface 24 on the contact surface. The rough surface 24 being formed has, for example, a transmittance of 25% and a scattering reflectance of 75%.

The rough surface 24 is not necessarily formed on the entire surface of the contact surface of the peripheral portion of the upper chamber window 63, and may be formed on part of the region. Note that the rough surface 24 is not preferably formed on at least the area, which contacts the O ring 21, of the contact surface of the peripheral portion of the upper chamber window 63. In other words, the rough surface 24 is preferably formed in the region of the contact surface of the peripheral portion of the upper chamber window 63 except for the area contacting the O ring 21. The reason is that sealing properties may be impaired if the rough source 24 is formed on the area, which contacts the O ring 21, of the contact surface of the upper chamber window 63. To obtain the sealing properties, the area, which contacts the O ring 21, of the contact surface of the peripheral portion of the upper chamber window 63 may have the rough surface 24 having finer grains by blasting than grains of another portion.

Since the rough surface 24 is formed on the contact surface of the peripheral portion of the upper chamber window 63, the flash light traveling into the peripheral portion of the upper chamber window 63 during irradiation with flash light is scattered by the rough surface 24 and is prevented from traveling toward the O ring 21. This significantly reduces an amount of flash light reaching the O ring 21. In other words, the rough surface 24 formed on the surface of the peripheral portion of the upper chamber window 63 blocks the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

<Sixth Embodiment>

Next, a sixth embodiment of the present invention is described. A heat treatment apparatus in the sixth embodiment has almost the same overall configuration as that in the first embodiment. A procedure for treatment of a semiconductor wafer W in the sixth embodiment is also the same as that in the first embodiment. The difference between the sixth embodiment and the first embodiment is that instead of the plurality of grooves 22 formed on the surfaces of the peripheral portion of the upper chamber window 63 in the first embodiment, a rough surface is formed on a surface of the peripheral portion of the upper chamber window 63 in the sixth embodiment.

Figure 13:
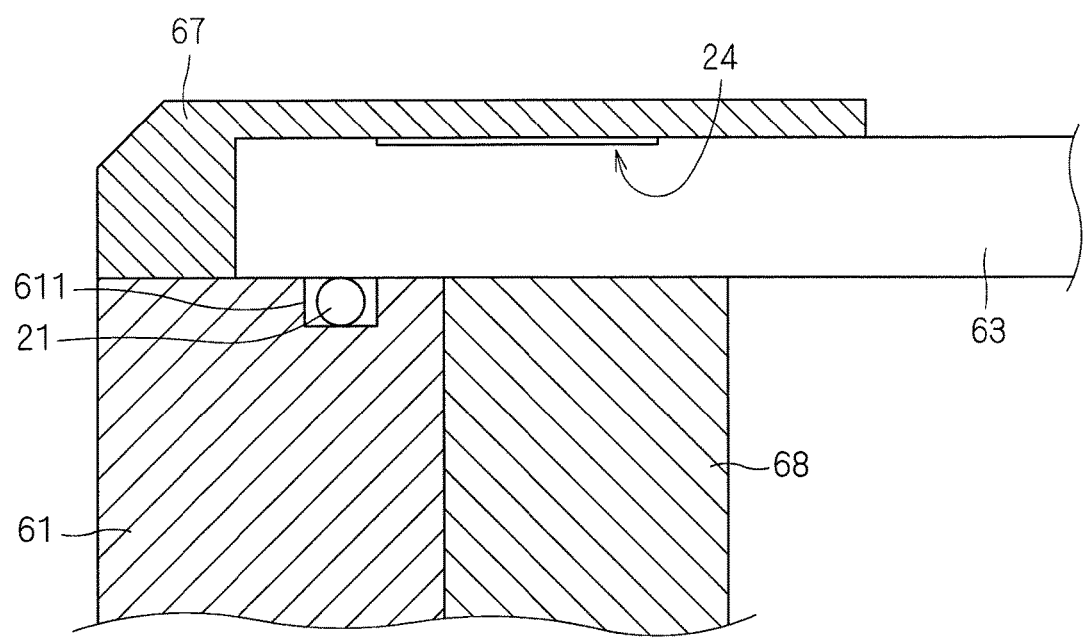
FIG. 13 shows a configuration of a peripheral portion of an upper chamber window in a sixth embodiment.

FIG. 13 shows a configuration of the peripheral portion of the upper chamber window 63 in the sixth embodiment. In FIG. 13, the same components as those in the first embodiment (FIG. 8) are denoted by the same references. In the sixth embodiment, a counter surface (upper surface) of the peripheral portion of the upper chamber window 63 on which blasting is performed is a rough surface 24. Specifically, blasting that sprays, for example, fine particles mixed in compressed air onto the counter surface of the peripheral portion of the upper chamber window 63 allows surface grinding of the counter surface, thereby forming the rough surface 24 on the counter surface. The rough surface 24 being formed has, for example, a transmittance of 25% and a scattering reflectance of 75%. The rough surface 24 is not necessarily formed on the entire surface of the counter surface of the peripheral portion of the upper chamber window 63, and may be formed on part of the region.

Since the rough surface 24 is formed on the counter surface of the peripheral portion of the upper chamber window 63, the flash light traveling into the peripheral portion of the upper chamber window 63 during irradiation with flash light is scattered by the rough surface 24 and is prevented from traveling toward the O ring 21. This significantly reduces an amount of flash light reaching the O ring 21. In other words, the rough surface 24 formed on the surface of the peripheral portion of the upper chamber window 63 blocks the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

<Seventh Embodiment>

Next, a seventh embodiment of the present invention is described. A heat treatment apparatus in the seventh embodiment has almost the same overall configuration as that in the first embodiment. A procedure for treatment of a semiconductor wafer W in the seventh embodiment is also the same as that in the first embodiment. The difference between the seventh embodiment and the first embodiment is that instead of the plurality of grooves 22 formed on the surfaces of the peripheral portion of the upper chamber window 63 in the first embodiment, rough surfaces are formed on surfaces of the peripheral portion of the upper chamber window 63 in the seventh embodiment.

In the seventh embodiment, a contact surface (lower surface) and a counter surface (upper surface) of the peripheral portion of the upper chamber window 63 on which blasting is performed are rough surfaces 24. In other words, the regions on which the rough surfaces 24 are formed in the seventh embodiment include a combination of the fifth embodiment and the sixth embodiment. The blasting technique in the seventh embodiment is also the same as that in the fifth embodiment and the sixth embodiment.

Since the rough surfaces 24 are formed on the contact surface and the counter surface of the peripheral portion of the upper chamber window 63, the flash light traveling into the peripheral portion of the upper chamber window 63 during irradiation with flash light is scattered by the rough surfaces 24 and is prevented from traveling toward the O ring 21. This significantly reduces an amount of flash light reaching the O ring 21. In other words, the rough surfaces 24 formed on the surfaces of the peripheral portion of the upper chamber window 63 block the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

<Eighth Embodiment>

Next, an eighth embodiment of the present invention is described. A heat treatment apparatus in the eighth embodiment has almost the same overall configuration as that in the first embodiment. A procedure for treatment of a semiconductor wafer W in the eighth embodiment is also the same as that in the first embodiment. The difference between the eighth embodiment and the first embodiment is that opaque quartz is provided in the peripheral portion of the upper chamber window 63 in the eighth embodiment.

FIGS. 14 to 17 are diagrams each showing a structure of the peripheral portion of the upper chamber window 63 in the eighth embodiment. In FIGS. 14 to 17, the same components as those in the first embodiment (FIG. 8) are denoted by the same references. In the eighth embodiment, opaque quartz 25 is provided in the peripheral portion of the upper chamber window 63 being a quartz window. The opaque quartz 25 is, for example, quartz containing minute air bubbles, which reduce a transmittance of light. The opaque quartz 25 has an extremely low transmittance of the flash light emitted from the flash lamps FL with respect to a wavelength range (for example, lower than or equal to 1% with a thickness of 3 mm).

In an example shown in FIG. 14, the opaque quartz 25 having an annular shape is welded to an outer peripheral end portion of the upper chamber window 63. The opaque quartz 25 having the annular shape has an outer diameter greater than a diameter of the O ring 21 and has an inner diameter smaller than the diameter of the O ring 21. Thus, in the example of FIG. 14, the opaque quartz 25 is formed in the entire peripheral portion of the upper chamber window 63 including the area contacting the O ring 21.

In an example shown in FIG. 15, after a groove whose section is semicircular is formed into an annular shape in the area, which contacts the O ring 21, of the contact surface (lower surface) of the peripheral portion of the upper chamber window 63, the opaque quartz 25 is welded such that the groove portion is filled with the opaque quartz 25.

In an example shown in FIG. 16, after a groove whose section is rectangular is formed into an annular shape in the area, which contacts the O ring 21, of the contact surface of the peripheral portion of the upper chamber window 63, the opaque quartz 25 is welded such that the groove portion is filled with the opaque quartz 25.

Further, in an example shown in FIG. 17, a step is formed in a region including the area, which contacts the O ring 21, of the contact surface of the peripheral portion of the upper chamber window 63, and the opaque quartz 25 is welded to the region such that the region has no step. The example shown in FIG. 17 can also be considered that the groove and the opaque quartz 25 of the example shown in FIG. 16 are extended to the outer peripheral end of the upper chamber window 63.

In all of the examples shown in FIGS. 14 to 17, the opaque quartz 25 is formed in the area, which contacts the O ring 21, of the contact surface of the peripheral portion of the upper chamber window 63. Therefore, the contact between the opaque quartz 25 and the O ring 21 allows sealing properties to be maintained in the eighth embodiment. Thus, the opaque quartz 25 used in the eighth embodiment preferably has low surface roughness and high smoothness.

Since the opaque quartz 25 is provided in the area, which contacts the O ring 21, of the contact surface of the peripheral portion of the upper chamber window 63, the flash light traveling into the peripheral portion of the upper chamber window 63 during irradiation with flash light is shielded by the opaque quartz 25 and is prevented from traveling toward the O ring 21. This significantly reduces an amount of flash light reaching the O ring 21. In other words, the opaque quartz 25 formed in the peripheral portion of the upper chamber window 63 blocks the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

Moreover, similarly to the quartz being the material for the upper chamber window 63, the opaque quartz 25 is also in no danger of contaminating the inside of the chamber 6 that treats the semiconductor wafer W.

<Ninth Embodiment>

Next, a ninth embodiment of the present invention is described. A heat treatment apparatus in the ninth embodiment has almost the same overall configuration as that in the first embodiment. A procedure for treatment of a semiconductor wafer W in the ninth embodiment is also the same as that in the first embodiment. The difference between the ninth embodiment and the first embodiment is that opaque quartz is provided in the peripheral portion of the upper chamber window 63 in the ninth embodiment.

FIGS. 18 to 25 are diagrams each showing a structure of the peripheral portion of the upper chamber window 63 in the ninth embodiment. In FIGS. 18 to 25, the same components as those in the first embodiment (FIG. 8) are denoted by the same references. In the ninth embodiment, opaque quartz 25 is provided in the peripheral portion of the upper chamber window 63 being a quartz window. Note that the area contacting the O ring 21 is made of transparent quartz in the ninth embodiment. The transparent quartz is the same as the quartz forming the upper chamber window 63 and allows the flash light emitted from the flash lamps FL to pass through the transparent quartz.

Figure 18:
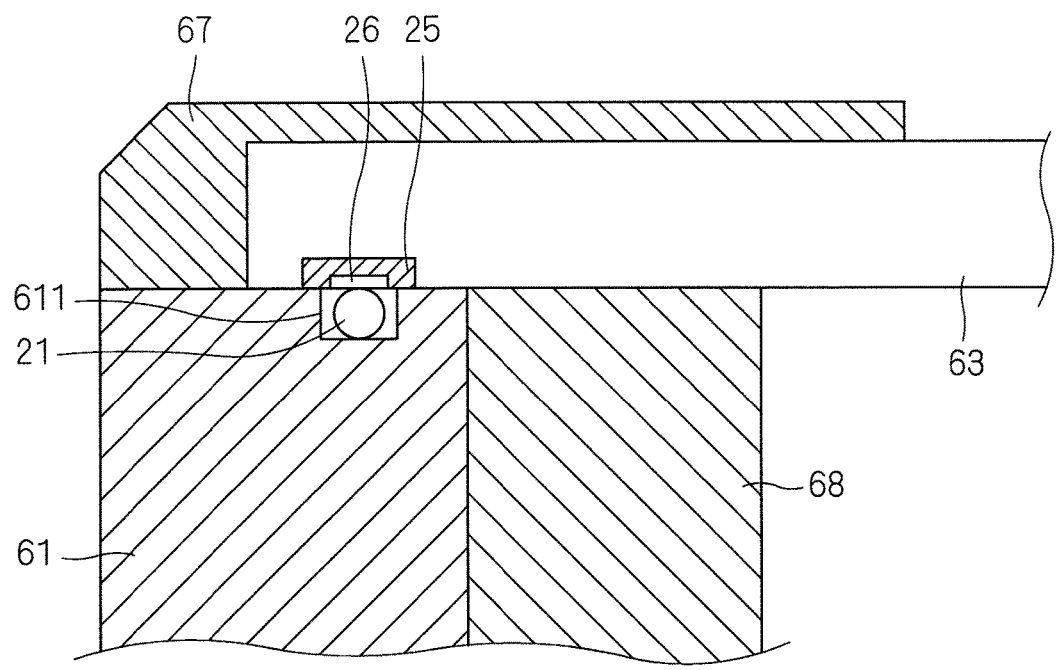
FIG. 18 shows an example of a structure of a peripheral portion of an upper chamber window in a ninth embodiment.

In an example shown in FIG. 18, after a groove whose section is rectangular is formed into an annular shape in the area, which contacts the O ring 21, of the contact surface of the peripheral portion of the upper chamber window 63, the opaque quartz 25 is welded such that the groove portion is filled with the opaque quartz 25. Furthermore, a groove whose section is rectangular is formed into an annular shape in an area, which contacts the O ring 21, of a surface of the opaque quartz 25, and transparent quartz 26 is then welded such that the groove portion is filled with the transparent quartz 26.

In an example shown in FIG. 19, the opaque quartz 25 having the annular shape is welded to the outer peripheral end portion of the upper chamber window 63, and furthermore, the transparent quartz 26 having the annular shape is welded to an outer peripheral surface of the opaque quartz 25. The opaque quartz 25 having the annular shape has an outer diameter and an inner diameter smaller than the diameter of the O ring 21. The transparent quartz 26 having the annular shape has an outer diameter greater than the diameter of the O ring 21 and has an inner diameter smaller than the diameter of the O ring 21. Thus, in the example of FIG. 19, the area, which contacts the O ring 21, of the peripheral portion of the upper chamber window 63 is made of the transparent quartz 26, and the opaque quartz 25 having the annular shape is provided on the inner side of the transparent quartz 26.

Figure 20:
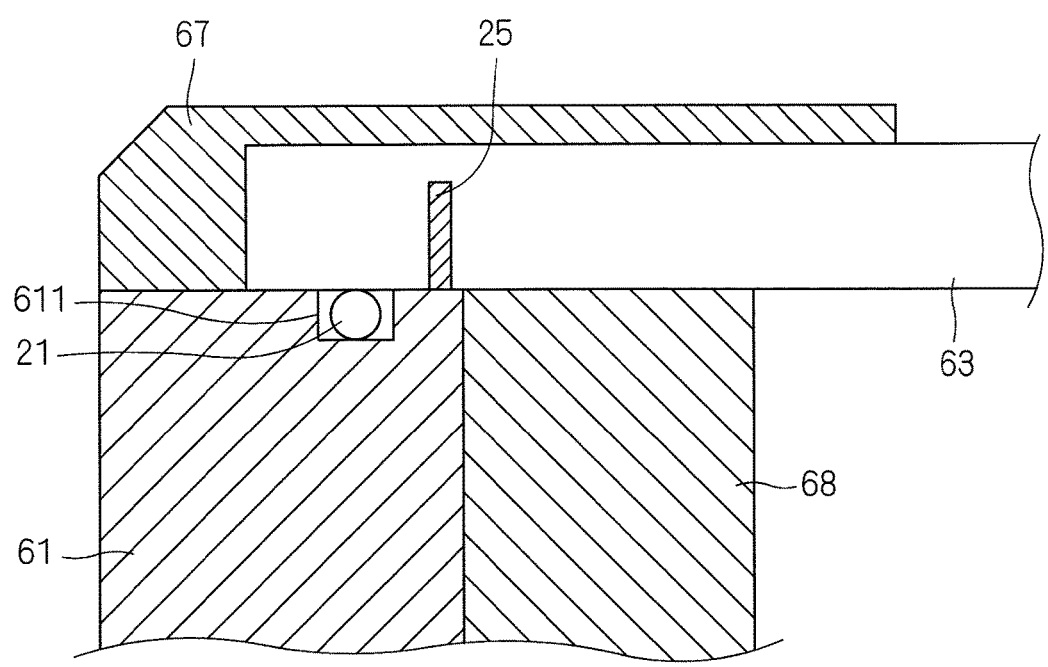
FIG. 20 shows another example of the structure of the peripheral portion of the upper chamber window in the ninth embodiment.

In an example shown in FIG. 20, after a groove whose section is rectangular is formed into an annular shape on the inner side of the area, which contacts the O ring 21, of the peripheral portion of the upper chamber window 63, the opaque quartz 25 is welded such that the groove portion is filled with the opaque quartz 25. Thus, the area, which contacts the O ring 21, of the peripheral portion of the upper chamber window 63 is made of the transparent quartz, and a wall of the opaque quartz 25 is formed on the inner side of the area contacting the O ring 21, as shown in FIG. 20. The wall of the opaque quartz 25 has a height to the extent that the light traveling into the peripheral portion of the upper chamber window 63 is blocked from reaching the contact portion between the peripheral portion of the upper chamber window 63 and the O ring 21. The example shown in FIG. 19 can be considered that the height of the wall of the opaque quartz 25 of the example shown in FIG. 20 is extended to vertically penetrate the upper chamber window 63.

In an example shown in FIG. 21, after grooves whose section is rectangular are formed into an annular shape and arranged alternately from the upper side and the lower side on the inner side of the area, which contacts the O ring 21, of the peripheral portion of the upper chamber window 63, the opaque quartz 25 is welded such that the two groove portions are filled with the opaque quartz 25. Thus, the area, which contacts the O ring 21, of the peripheral portion of the upper chamber window 63 is made of the transparent quartz, and the two walls of the opaque quartz 25 are alternately arranged on the inner side of the area contacting the O ring 21, as shown in FIG. 21. A height position of the top end of the opaque quartz 25 from the lower side is higher than a height position of the bottom end of the opaque quartz 25 from the upper side. Consequently, the light traveling into the peripheral portion of the upper chamber window 63 is shielded by the two walls of the opaque quartz 25 and does not reach the contact portion between the peripheral portion of the upper chamber window 63 and the O ring 21. The example shown in FIG. 21 includes two walls of the opaque quartz 25 of the example shown in FIG. 20 arranged alternately from the top and the bottom of the upper chamber window 63.

Figure 22:
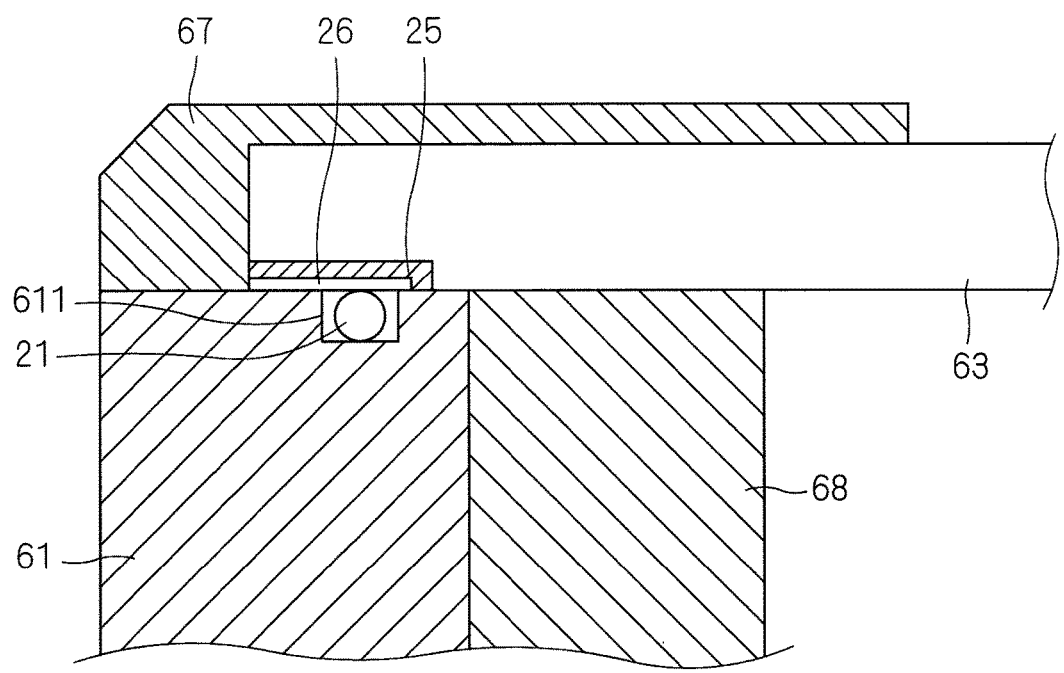
FIG. 22 shows another example of the structure of the peripheral portion of the upper chamber window in the ninth embodiment.

In an example shown in FIG. 22, a step is formed in a region including the area, which contacts the O ring 21, of the contact surface of the peripheral portion of the upper chamber window 63. After the opaque quartz 25 whose section is an L-shape is welded to the entire perimeter of the region, the transparent quartz 26 is welded to the entire perimeter of the opaque quartz 25 such that the region has no step inside the L-shape. The transparent quartz 26 has an outer diameter greater than the diameter of the O ring 21 and has an inner diameter smaller than the diameter of the O ring 21. Thus, in the example of FIG. 22, the area contacting the O ring 21 is made of the transparent quartz 26 whose inside and upper side are covered with the opaque quartz 25. The example shown in FIG. 22 can be considered that a step is further formed in the area, which contacts the O ring 21, of the opaque quartz 25 of the example shown in FIG. 17, and the transparent quartz 26 is then welded to the region such that the region has no step.

Figure 23:
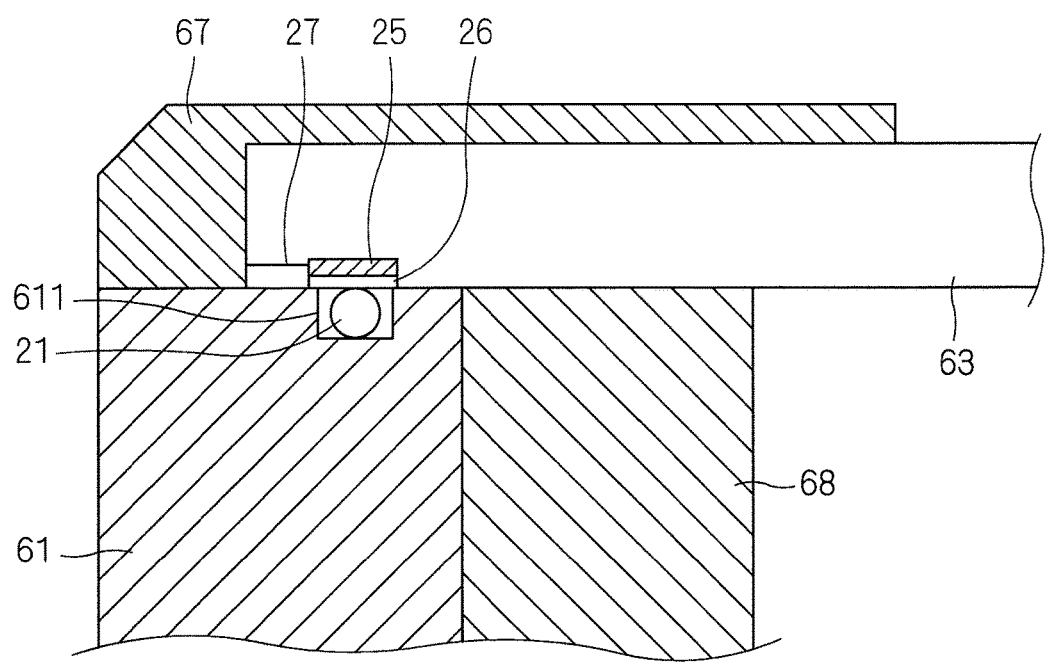
FIG. 23 shows another example of the structure of the peripheral portion of the upper chamber window in the ninth embodiment.

In an example shown in FIG. 23, after a groove whose section is rectangular is formed into an annular shape in the area, which contacts the O ring 21, of the contact surface of the peripheral portion of the upper chamber window 63, the opaque quartz 25 having the annular shape is fitted into the groove. Furthermore, the transparent opaque 26 is welded to the entire perimeter of the opaque quartz 25 so as to cover the opaque quartz 25 fitted into the groove. Thus, as shown in FIG. 23, the ring of the opaque quartz 25 is included inside the upper chamber window 63, and the area, which contacts the O ring 21, of the peripheral portion of the upper chamber window 63 is made of the transparent quartz 26 whose upper side is covered with the opaque quartz 25. Note that accumulation of air may occur around the interface of the opaque quartz 25 in the example shown in FIG. 23, and the accumulation of air is in danger of being thermally expanded and breaking the upper chamber window 63 during the heat treatment, so that an air vent port 27 causing the interface of the opaque quartz 25 and the outside of the upper chamber window 63 to communicate with each other is preferably provided as appropriate.

Figure 24:
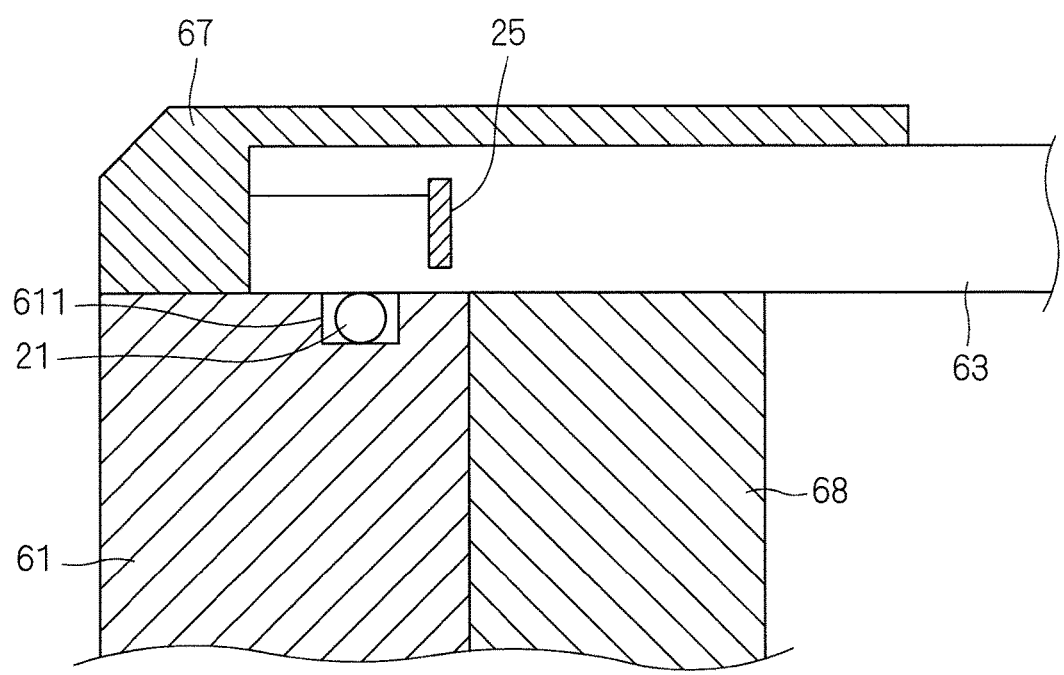
FIG. 24 shows another example of the structure of the peripheral portion of the upper chamber window in the ninth embodiment.

In an example shown in FIG. 24, after a groove whose section is rectangular is formed into an annular shape on the inner side of the area, which contacts the O ring 21, of the peripheral portion of the upper chamber window 63, the opaque quartz 25 having the annular shape is fitted into the groove. Furthermore, transparent opaque is welded to the entire perimeter of the opaque quartz 25 so as to cover the opaque quartz 25 fitted into the groove. Thus, as shown in FIG. 24, the upper chamber window 63 includes the ring of the opaque quartz 25 therein, and the wall of the opaque quartz 25 is formed on the inner side of the area, which contacts the O ring 21 and is made of the transparent quartz, of the peripheral portion of the upper chamber window 63. The wall of the opaque quartz 25 has a height to the extent that the light traveling into the peripheral portion of the upper chamber window 63 is blocked from reaching the contact portion between the peripheral portion of the upper chamber window 63 and the O ring 21. The example shown in FIG. 24 can be considered that the height of the wall of the opaque quartz 25 of the example shown in FIG. 20 is lowered and is fitted into the upper chamber window 63. Note that accumulation of air may occur around the interface of the opaque quartz 25 also in the example shown in FIG. 24, and the accumulation of air is in danger of being thermally expanded and breaking the upper chamber window 63, so that an air vent port causing the interface of the opaque quartz 25 and the outside of the upper chamber window 63 to communicate with each other is preferably provided similarly to the example shown in FIG. 23.

In an example shown in FIG. 25, a groove having an annular shape is formed from the end face of the upper chamber window 63 toward the center thereof, and the opaque quartz 25 is welded such that the groove portion is filled with the opaque quartz 25. Thus, as shown in FIG. 25, the area; which contacts the O ring 21, of the peripheral portion of the upper chamber window 63 is made of transparent quartz whose upper side is covered with the opaque quartz 25. The opaque quartz 25 has a length from the end face of the upper chamber 63 toward the center thereof to the extent that the light traveling into the peripheral portion of the upper chamber window 63 is blocked from reaching the contact portion between the peripheral portion of the upper chamber window 63 and the O ring 21. In addition, a ring of the opaque quartz 25 circumferentially divided into several parts may be fitted into the groove portion and welded thereto.

In the examples shown in FIGS. 18 to 25, the opaque quartz 25 is provided in the peripheral portion of the upper chamber window 63 while the area, which contacts the O ring 21, of the contact surface of the peripheral portion of the upper chamber window 63 is made of the transparent quartz 26. Therefore, the contact between the transparent quartz 26 and the O ring 21 allows sealing properties to be maintained in the ninth embodiment. Transparent quartz can typically have lower surface roughness and higher smoothness than opaque quartz. When the area contacting O ring 21 is made of the transparent quartz 26, more improved sealing properties can be achieved.

The opaque quartz 25 is provided so as to block the flash light traveling into the peripheral portion of the upper chamber window 63 during irradiation with flash light from reaching the contact portion between the peripheral portion of the upper chamber window 63 and the O ring 21. This significantly reduces an amount of flash light reaching the O ring 21. In other words, the opaque quartz 25 provided in the peripheral portion of the upper chamber window 63 blocks the flash light that is emitted from the flash lamps FL and travels into the peripheral portion of the upper chamber window 63 from reaching the O ring 21. As a result, the O ring 21 is prevented from exposure to the flash light during the irradiation with the flash light, which can prevent the degradation of the O ring 21 due to the irradiation with the flash light.

Moreover, similarly to the quartz being the material for the upper chamber window 63 and the transparent quartz 26, the opaque quartz 25 is also in no danger of contaminating the inside of the chamber 6 that treats the semiconductor wafer W.

<Modifications>

While the embodiments of the present invention have been described above, various modifications in addition to those described above may be made to the invention without departing from the purpose of the invention. For example, in each of the embodiments, a light-exposure blocking portion blocking the light that is emitted from the flash lamps FL and travels into the peripheral portion of the upper chamber window 63 from reaching the O ring 21 is formed in the peripheral portion of the upper chamber window 63. In addition to this, the back surface (surface contacting the peripheral portion of the upper chamber window 63) of the clamping ring 67 may be roughened by blasting or may be mirror-finished by forming a metal film thereon. This can further reduce the flash light reaching the O ring 21 during irradiation with flash light.

In the seventh embodiment, both of the contact surface (lower surface) and the counter surface (upper surface) of the peripheral portion of the upper chamber window 63 on which blasting is performed are the rough surfaces 24. In addition to this, the end face of the peripheral portion of the upper chamber window 63 may also have a rough surface formed thereon by blasting. Forming the rough surface also on the end face of the peripheral portion of the upper chamber window 63 can more reliably block the flash light from reaching the O ring 21 during irradiation with flash light.

Although the light-exposure blocking portion is formed in the peripheral portion of the upper chamber window 63 in each of the embodiments above, the lower chamber window 64 and the chamber side portion 61 are sealed together by sandwiching the O ring therebetween, and thus a similar light-exposure blocking portion may also be formed in the peripheral portion of the lower chamber window 64. The flash light rarely reaches the lower chamber window 64, but the halogen light emitted from the halogen lamps HL travels into the lower chamber window 64. Thus, forming the light-exposure blocking portion in the peripheral portion of the lower chamber window 64 can prevent degradation of the O ring due to the halogen light.

Although the semiconductor wafer W is preheated with the halogen lamps HL in each of the embodiments above, the semiconductor wafer W may be placed on a hot plate and be preheated instead.

Although the flash heating portion 5 includes the 30 flash lamps FL in each of the embodiments above, the present invention is not limited thereto. The flash heating portion 5 may include a freely-selected number of flash lamps FL. The flash lamps FL are not limited to xenon flash lamps, and may be krypton flash lamps. The number of halogen lamps HL included in the halogen heating portion 4 is not limited to 40 and may be freely selected in such manner that a plurality of halogen lamps HL are disposed both in an upper row and a lower row.

A substrate to be treated by the heat treatment apparatus of the present invention is not limited to a semiconductor wafer, and may be a glass substrate used in a flat-panel display such as a liquid crystal display, or a substrate for use in solar cell. The technology of the present invention is also applicable to bonding between metal and silicon, crystallization of polysilicon, or the like.

While the invention has been described in detail, the foregoing description is in all aspects illustrative and not restrictive. It is therefore understood that numerous other modifications and variations can be devised without departing from the scope of the invention.

What is claimed is:

1. A heat treatment apparatus that irradiates a substrate with flash light to heat the substrate, comprising:
    a chamber housing the substrate;
    a retainer configured to retain the substrate in the chamber;
    an exhaust configured to exhaust the chamber and to reduce an inside pressure in the chamber to less than atmospheric pressure;
    a flash lamp provided outside the chamber and on one side of the chamber;
    a quartz window covering an opening of the one side of the chamber;
    an O ring sandwiched between a side wall of the chamber and a contact surface of a peripheral portion of the quartz window; and
    a window retainer configured to press a counter surface opposed to the contact surface of the peripheral portion of the quartz window against the side wall of the chamber,
    wherein a step is provided in the contact surface of the quartz window, and an opaque quartz that contacts the O ring is provided in the step.

* * * * *